US006534870B1

(12) United States Patent
Shimooka et al.

(10) Patent No.: US 6,534,870 B1
(45) Date of Patent: Mar. 18, 2003

(54) APPARATUS AND METHOD FOR MANUFACTURING A SEMICONDUCTOR DEVICE

(75) Inventors: Yoshiaki Shimooka, Kawasaki (JP); Noriaki Matsunaga, Chigasaki (JP); Hideki Shibata, Yokohama (JP); Rempei Nakata, Kamakura (JP); Hideshi Miyajima, Yokohama (JP); Motonobu Kawai, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/594,843

(22) Filed: Jun. 15, 2000

(30) Foreign Application Priority Data

Jun. 15, 1999 (JP) ........................................ 11-168763
Sep. 21, 1999 (JP) ........................................ 11-267198

(51) Int. Cl.[7] ...................... H01L 23/485; H01L 23/522

(52) U.S. Cl. ...................... 257/759; 257/758; 257/760

(58) Field of Search ............................ 438/783, 623, 438/624, 763, 784, 789, 681, 474; 257/52, 55, 76, 701, 310, 360, 780, 207, 750, 758, 759, 760

(56) References Cited

U.S. PATENT DOCUMENTS 5,587,612 A * 12/1996 Sugiyama
5,619,072 A * 4/1997 Mehta
5,702,982 A * 12/1997 Lee et al.
6,033,977 A * 3/2000 Gutsche et al.
6,218,299 B1 * 4/2001 Akahori et al.

FOREIGN PATENT DOCUMENTS

JP 01175246 A * 7/1989
JP 10-189577 7/1998

OTHER PUBLICATIONS

Wolf, "Silicon Processing for the VLSI Era: vol. 2—Process Integration," 1990, Lattice Press, vol. 2, p. 180–181 and 265–266.*

Masao Otake et al., "ULSI Flattened Organic Coating Film Material," Electric Materials, Aug. (1996), pp. 52–55.

* cited by examiner

*Primary Examiner*—Nathan J. Flynn
*Assistant Examiner*—Kevin Quinto
(74) *Attorney, Agent, or Firm*—Finnegan, Henderson, Farabow, Garrett & Dunner, L.L.P.

(57) ABSTRACT

Al wirings of first to fifth layers are formed on a P—$SiO_2$ film, and FSG films are formed between the wiring layers. An organic silicon oxide film is formed between wirings in one same wiring layer. The Al wirings in the first and second layers have a carbon concentration of 22 wt %, and the Al wirings in the third to fifth layers have a carbon concentration of 20 wt %.

18 Claims, 22 Drawing Sheets

54
192-1
192-2
192-m
51
50
49
191-1
191-2
191-m
46
45
44
43
42
41
5
4
3
2
1

APPARATUS AND METHOD FOR MANUFACTURING A SEMICONDUCTOR DEVICE

CROSS-REFERENCE TO RELATED APPLICATIONS

This application is based upon and claims the benefit of priority from the prior Japanese Patent Applications No. 11-168763, filed Jun. 15, 1999; and No. 11-267198, filed Sep. 21, 1999, the entire contents of which are incorporated herein by reference.

BACKGROUND OF THE INVENTION

The present invention relates to an apparatus and a method for manufacturing a semiconductor device having a wiring structure between inter-layer insulating films. The present invention also relates to an apparatus and a method for manufacturing a semiconductor device having a multi-layer wiring structure on a substrate where transistors are formed.

Due to downsizing of wiring sizes, the wiring resistance and wiring capacitance tend to steadily increase and have come to greatly affect the operation frequency and power consumption of the devices. Hence, to reduce the wiring capacitance and to realize higher performance of the device, studies and developments have been eagerly made with respect to an $SiO_2$ film (FSG), an organic $SiO_2$ film, an organic film, and the like added with F having a low dielectric constant, in place of an $SiO_2$ film (P—$SiO_2$ film) formed by a plasma CVD method which has been conventionally used as an inter-layer insulating film.

Any of those materials, however, has advantages and disadvantages compared with the P—$SiO_2$ film, so that various problems exist in application of those materials to inter-layer insulating films in an LSI.

A problem concerning an FSG film is reduction of moisture absorption caused when F is added at a high concentration (the dielectric constant decreases in proportion to the addition amount of F) and is left in the atmosphere. Where this moisture absorption is considered, it is known that the practical application range of the FSG film is 3.3 or more.

Meanwhile, the organic $SiO_2$ film has an excellent moisture-absorption resistance even in case of a material having a low dielectric constant of 3.0 or less. However, there is a problem that it is not possible to perform processing of a fine hole pattern which causes cracking due to an $O_2$ plasma used for peeling a resist. Taking into consideration these problems, it has been difficult to adopt an organic $SiO_2$ film of a single layer film as an inter-layer insulating film in an LSI.

Therefore, discussion is made as to application of a combination of an organic $SiO_2$ film and, for example, an inorganic film of SiN, $SiO_2$, FSG, or the like to an inter-layer insulating film in a multilayer wiring. However, the dielectric constant is higher compared with the case of using an organic $SiO_2$ film as a single layer. In addition, in case where organic $SiO_2$ films are multilayered into four or five layers, there is a problem that cracking is caused in heating steps or peeling occurs in CMP steps. As a result, it has been difficult to prepare a multilayer wiring which provides high reliability by the combination of an organic film and an inorganic film.

The above problems will be explained with reference to the drawings.

FIG. 1 is a cross-sectional view showing a semiconductor device which realizes a multilayer structure by combining a silicon oxide film and an FSG film. The reference 81 denotes a P—$SiO_2$ film and the references 84, 88, 92, 96, and 100 are respectively first to fifth Al wirings. FSG films are used for 85, 89, 93, and 97 as inter-layer films. Also, the references 82, 86, 90, 94, and 98 are inter-wiring films, i.e., films which insulate wirings in one same wiring layer from each other and organic silicon oxide films having a predetermined carbon concentration are used for the inter-wiring films. Also, Nb films are used for the references 83, 87, 91, 95, and 99 as liner materials. In this multilayer structure, cracking 101 occurs due to a stress in the organic silicon oxide film as a inter-wiring film of the Al wiring 84 which is in the lowermost layer.

FIG. 2 shows a single wiring structure, and the reference 111 is an organic silicon oxide film having a BPSG film on which devices not shown are formed, and the references 112 and 113 are organic silicon oxide films having a predetermined carbon concentration. In case of manufacturing this wiring structure, an anti-reflection film (ARL) and a resist are applied and developed when patterning an organic silicon oxide film 113. RIE is used to process a groove. However, if RIE using an $O_2$ gas is used to remove the anti-reflection and resist, cracking 114 occurs at the bottom portion of the groove.

FIG. 3 is an enlarged view of a main part of a wiring structure, like FIG. 2. The reference 121 denotes a P—$SiO_2$ film, and the reference 122 denotes an organic silicon oxide film having a predetermined carbon concentration. An Al wiring 124 is formed in a groove portion formed in the organic silicon oxide film 122, with an Nb film 123 as a liner material interposed. On the Al wiring 124 and the organic silicon oxide film 122, an organic silicon oxide film 125 having a predetermined carbon concentration is formed as an inter-layer film. Also, to make contact with Al wiring 124, a hole from which the Al wiring 124 is exposed is formed in the organic silicon oxide film 125.

If etching is performed during formation of this hole, etching sufficiently reaches the bottom surface in case of forming a hole 126 having relatively loose dimensions. Otherwise, in case of forming a hole 127 having a fine small hole 127, a polymerized product contained in the organic silicon oxide film 126 is created. If this polymerized product is created, there appears a phenomenon of etch-stop in which the resist merely shifts back and stops halfway, resulting in a problem that the etching cannot sufficiently reaches the Al wiring 124.

Thus, in case of a conventional wiring structure, cracking occurs in an inter-layer insulating film in a heating step and during peeling of a resist. A problem hence appears in that the etch-stop occurs during formation of a wiring groove.

Meanwhile, in a multilayer wiring of a large scale integrated circuit (LSI), the following problem has been cited. An upper-layer wiring is constructed under looser rules than a lower-layer wiring, and the width and thickness of the upper-layer wiring are two to four times larger than those of the lower-layer wiring. For example, the uppermost-layer wiring of a logic device having a gate length of 0.25 μm has a wiring width and a wiring thickness which respectively reach 2.2 μm and 1.6 μm. This wiring has a seven times larger compared with the first-layer wiring, as well as a three times larger thickness. This is to restrict the RC delays of the signal wirings as much as possible. The resistance component is decreased by increasing the cross-sectional area of the wiring, and the inter-wiring capacitance component and the inter-layer distance capacitance component are decreased by increasing the inter-wiring distance and the inter-layer distance. In this case, since the size in the thickness direction is increased, the film thickness must be increased with respect to an insulating film (hereinafter called an inter-layer insulating film) corresponding to the portion of the wiring layers on the structure.

However, even an insulating film made of one single layer cannot be deposited as thick as possible. Problems appearing when an insulating film is deposited to be thick will be explained with reference to FIG. 4. The semiconductor device shown in FIG. 4 is a semiconductor device which has a wiring structure of n layers. inter-wiring insulating films 2, 6, 14, and 17 and inter-layer insulating films 4, 8, 10, and 14 are alternately formed on a semiconductor substrate 1. Further, a first-layer wiring 3, a second-layer wiring 7, an (n−1)-th-layer wiring layer, and an n-th-layer are consecutively formed between the insulating films, thereby forming a wiring structure of n layers. In this semiconductor device, it has been found that both the wiring width and thickness of the (n−1)-th-layer wiring 13 and the n-th-layer wiring 18 are larger than the first-layer-wiring 3 and the second-layer-wiring 7.

However, if the film thickness of the (n−1)-th-layer wiring 13 and that of the n-th-layer wiring 18 reach a certain critical film thickness, it is generally known that cracks 12*a* to 12*c*, 17*a*, and 17*b* are created or peeling (17*c*) is caused due to a stress which the insulating film 12 or 17 formed between the wirings 13 or 18 have. The problems of cracking and peeling still remain even if Damascene wiring is adopted.

In particular, when using an organic insulating film in which a dangling bond of a film forming element is ended by a methyl group or an ethyl group and a low-dielectric-constant film such as a silica-based porous film which has a micron physical space in the film or a concentration difference, the problems appear more clearly. At this time, the critical film thickness is about 1 μm. This critical film thickness is disclosed as a "ULSI flattened organic coating film material" in "Electric Materials" August, p. 53 (1996) by Masao Otake et. al. In the future, this critical film thickness will surely make a significant obstacle in manufacturing a device using a low-dielectric-constant insulating film.

Thus, in semiconductor devices using conventional multilayer wiring structures, delays of signals are restricted, and it is therefore considered that the inter-wiring distance and inter-layer distance need to be large. To realize this, the dimension in the wiring thickness direction must be increased thereby increasing the dimensions of the insulating films formed between the wirings. However, there is a risk of cracking or peeling due to the critical film thickness of the insulating film itself.

BRIEF SUMMARY OF THE INVENTION

An object of the present invention is to provide a semiconductor device having a multilayer wiring structure with high reliability and a manufacturing method thereof.

Another object of the present invention is to provide a semiconductor device having a reduced influence of stress and a manufacturing method thereof.

According to an aspect of the present invention, there is provided a semiconductor device having a wiring structure in which at least one wiring layer including a wiring and an insulating film surrounding the wiring is formed on a substrate, wherein the insulating film of the at least one wiring layer has a carbon concentration and a metal oxide concentration, at least one of which differs in a film thickness direction.

According to another aspect of the present invention, there is provided a semiconductor device having a multilayer wiring structure in which a plurality of wiring layers each including a wiring and an insulating film surrounding the wiring are formed and layered on a substrate, wherein the insulating film of at least one of the plurality of wiring layers has a carbon concentration and a metal oxide concentration, at least one of which is different from a carbon concentration and a metal oxide concentration of the insulating film of another one of the plurality of wiring layers.

Also, according to another aspect of the present invention, there is provided a semiconductor device comprising: a wiring layer including a first insulating film and a plurality of wirings formed with the first insulating film interposed therebetween; a pillar formed by forming a metal film on the wiring layer and by removing selectively the metal film, thereby to make contact with the wiring; a second insulating film formed on the wiring layer so as to cover a side portion of the pillar; a third insulating film formed on the second insulating film and having a carbon concentration higher than that of the second insulating film; and a groove portion formed by removing selectively the third insulating film so as to expose the pillar.

Also, according to another aspect of the present invention, there is provided a method for manufacturing a semiconductor device, comprising steps of: forming a metal film on a wiring layer including a plurality of wirings formed with a first insulating film interposed therebetween; forming a pillar in contact with the wirings by removing selectively the metal film such that the wiring layer is exposed; forming a second insulating film on the wiring layer so as to cover a side portion of the pillar; forming a third insulating film having a carbon concentration higher than that of the second insulating film, on the second insulating film; and forming a groove portion to be connected with the wirings, in the third insulating film.

Also, according to another aspect of the present invention, there is provided a method for manufacturing a semiconductor device, comprising steps of: forming a second insulating film and a third insulating film having a carbon concentration and a metal oxide concentration, at least one of which differs from a carbon concentration and a metal oxide concentration of the second insulating film, on a wiring layer including a plurality of wirings formed with a first insulating film interposed therebetween; forming selectively a hole portion in the second and third insulating films; and forming a groove portion in the third insulating film so as to overlap the hole portion, with the second insulating film used as a stopper.

In the present invention, in the wiring structure formed on the substrate, the carbon concentration or the metal oxide concentration.is made different with respect to the insulating film at least one of a wiring layer. As a result, etch-stop which is caused when performing fine hole processing on the insulating film can be prevented. Also, if etching is used when forming a wiring groove in the insulating film, occurrence of cracking caused at the bottom surface when peeling a resist can also be prevented.

In particular, pillar process is used for making a contact which connects wirings with each other. As a result, fine hole processing is not necessary any more, so inter-layer insulating films and inter-wiring insulating films can be formed of materials having a low-dielectric constant. In addition, when forming a wiring groove above the pillar, the carbon concentration or the metal oxide concentration of the insulating film formed between pillars in one same layer is made different from the insulating film formed thereon. As a result of this, the controllability of the groove depth in processing of a wiring groove to be formed in the insulating film is improved so that the resistance variants of the wirings due to the groove depth can be restricted.

Also, according to the other aspect of the present invention, the carbon concentration or metal oxide concentration is made different between the layers of each other. As a result of this, the mechanical strength of the multiplayer wiring can be improved so that occurrence of cracking can be prevented.

Thus, according to the present invention, the reliability of the wiring structure can be improved.

Also, according to another aspect of the present invention, there is provided a semiconductor device having a multilayer wiring structure in which a plurality of wiring layers formed with an inter-wiring insulating film interposed therebetween are formed on a substrate with an inter-layer insulating film interposed therebetween, wherein the inter-wiring insulating film in at least one of the wiring layers corrects a stress caused in a film width direction in directions in which the stress is relaxed or at least one of a film stress and a film hardness value of the inter-wiring insulating film differs in a film thickness direction so that cracking might not be caused.

A definition will now be made with reference to an example of a stress $\sigma_f$ which is caused when a thin film made of $SiO_2$ is formed on a Si substrate.

$$\sigma_f = E_s/6(1-\nu)\cdot d_s^2/(d_f a) \tag{1}$$

The stress can be expressed as above. In this expression, $\nu$ is a Poisson ratio of the Si substrate, $E_s$ is a Young's modulus, $d_s$ is the thickness of the Si substrate, a is a radius of curvature, and $d_f$ is the thickness of a thin film.

In the expression (1), $\nu$ and $E_s$ are values inherent to materials, and $d_s$ and $d_f$ are defined uniformly. Therefore, the stress $\sigma_f$ is calculated if the radius of curvature a is known.

As shown in FIG. 16, where warp of the Si substrate 161 is h and the diameter of the substrate is D, relationships of $a^2=r^2+(D/2)^2$ and $a=r+h$ are given. Accordingly, $a \approx D2/8h$ is obtained in consideration of D>>h. This is substituted in the expression (1), and the following approximation is obtained.

$$\sigma_f = E_s/6(1-\nu)\cdot(8h/D^2)\cdot(d_s^2/d_f)$$

From this expression, it can be known that the stress $\sigma f$ is obtained if the warp h can be measured.

Also, the film hardness is micro Vickers hardness $H_v$. Generally, the film hardness is defined as $Hv=(2F\cdot\sin 136°/2)/d^2$ in a fine hardness test using a Vickers indenter of an equilateral rectangular pyramid having a face angle of 136°.

The structure of an inter-wiring insulating film which corrects the stress caused in the film width direction in which the stress is relaxed includes the following case. For example, if there is a layered structure comprised of a plurality of insulating films, the structure includes a case where one insulating film is made of a material which relaxes the stress of another insulating film, not only in case where adjacent layers are made of materials whose film stresses act in directions opposite to each other but also in case where the film stresses act in one same direction.

To achieve the object described above, according to another aspect of the present invention, there is provided a method for manufacturing a semiconductor device, comprising steps of: forming an insulating film having a film stress or a film hardness value which differs in a film thickness direction; forming a groove at a predetermined position of the insulating film; forming and burying a conductive film, including the groove; and removing the conductive film formed at portions other than the groove, thereby to form a wiring for connecting the substrate with the insulating film.

In the present invention, in a semiconductor device having a multilayer wiring structure, an insulating film having a structure in which at least one of the film stress and the film hardness differs in the film thickness direction is used as an inter-wiring insulating film formed between wirings, and correction is made in a direction in which the stress caused in the film width direction is relaxed. Accordingly, it is possible to prepare a multilayer wiring structure which does not cause cracking or peeling in the inter-wiring insulating film.

In addition, by applying the inter-wiring insulating film having this structure to the uppermost wiring layer or the two uppermost wiring layers, it is possible to suppress effectively cracking and peeling caused at the wiring layer portions where the film thickness and the film width are particularly large.

Also, as an inter-wiring insulating film of this kind, an insulating film having high film hardness is formed in contact with an insulating film having a so-called low-dielectric constant, which has a relative dielectric constant of 3 or less. Therefore, not only the problem of the film stress is solved but also reduction of the wiring capacity can be realized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

In the following, embodiments of the present invention will be explained with reference to the drawings. In the following embodiments, the term "inter-layer insulating film" means an insulating film which insulates wirings formed in one layer from wirings formed in another layer. The term "inter-wiring insulating film" means an insulating film which insulates wirings formed in one single layer from each other.

First Embodiment

Figure 5:
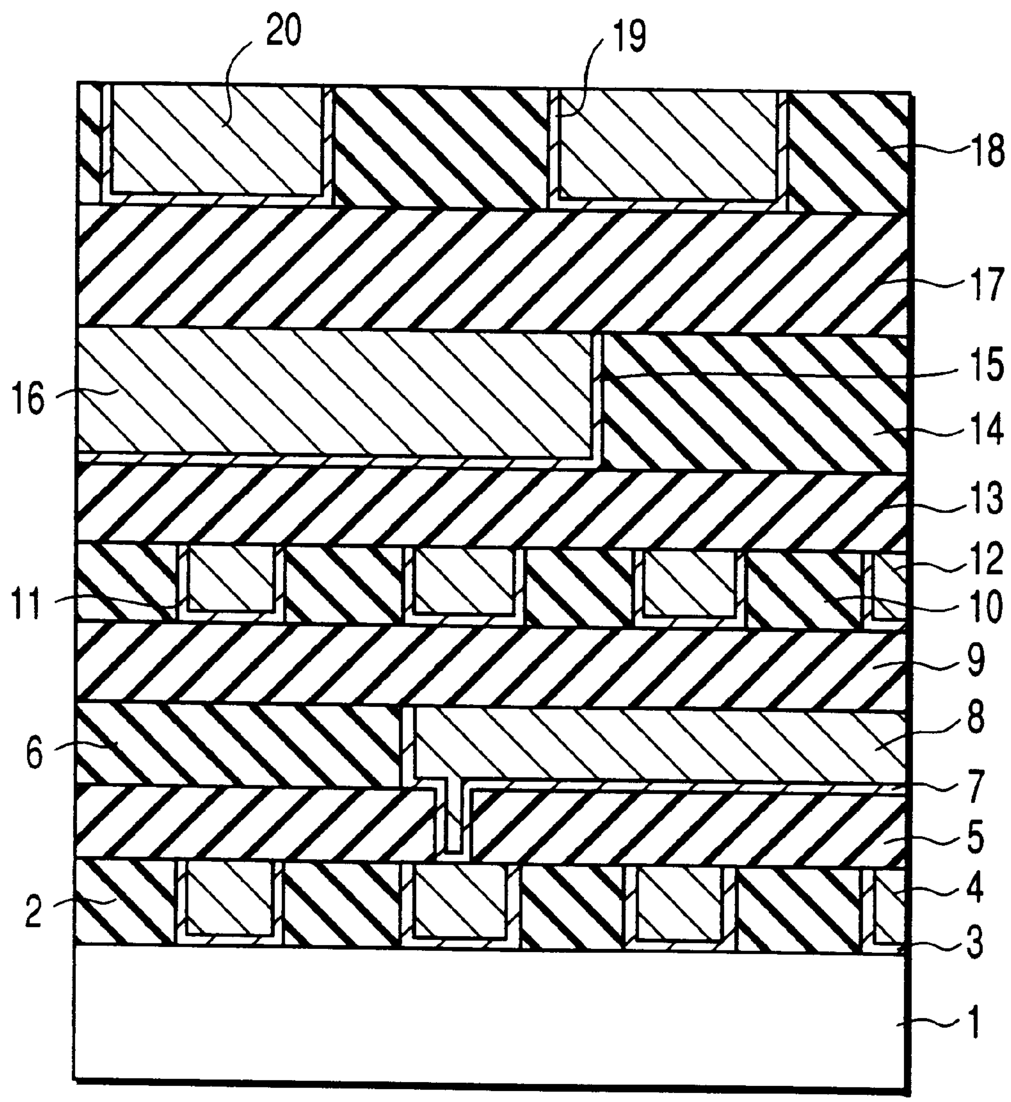
FIG. 5 is a cross-sectional view showing the entire structure of a semiconductor device according to the first embodiment of the present invention.

FIG. 5 shows the entire structure of a semiconductor device according to the first embodiment of the present invention. The reference 1 denotes a P—$SiO_2$ film where elements such as transistors not shown and the like are formed, i.e., a $SiO_2$ film is formed by a plasma CVD method. An organic silicon oxide film 2 having a carbon concentration of 22 wt % and a film thickness of 500 nm is formed on the P—$SiO_2$ film 1. Groove portions are formed in the organic silicon oxide film 2. A Nb film 3 having a film thickness of 15 nm is formed as a liner material on the side wall and the bottom surface of the groove portions. Further, an Al wirings 4 are formed in the groove portions. These components constitute the wiring structure of a first layer.

As an inter-layer insulating film, a silicon oxide film added with fluorine by a plasma CVD method, i.e., a FSG film 5 is formed with a film thickness of 500 nm, on the silicon oxide film 2 and the Al wirings 4. An organic silicon oxide film 6 having a carbon concentration of 22 wt % is formed with a film thickness of 400 nm, on the FSG film 5. Holes are formed through the organic silicon oxide film 6 and the FSG film 5 such that the Al wirings 4 are exposed therefrom. Further, groove portions are formed in the organic silicon oxide film 6, so as to overlap these holes. A Nb film 7 having a film thickness of 15 nm is formed as a liner material on the side walls and the bottom surfaces of the holes and the groove portions. Also, Al wirings 8 are formed in these holes and the groove portions. These components constitute the wiring structure of a second layer.

A FSG film 9 is formed as an inter-layer insulating film on the organic silicon oxide film 6 and the Al wirings 8. An organic silicon oxide film 10 having a carbon concentration of 20 wt % is formed on the FSG film 9. Groove portions are formed in this organic silicon oxide film 10. Al wirings 12 having a film thickness of 500 nm are formed in the grooves, with a Nb film 11 with a film thickness of 15 nm interposed as a liner material. These components constitute the wiring structure of a third layer.

A FSG film 13 is formed as an inter-layer insulating film on the organic silicon oxide film 10 and the Al wirings 12. An organic silicon oxide film 14 having a carbon concentration of 20 wt % is formed on the FSG film 13. Al wirings 16 having a film thickness of 1.0 $\mu$m are formed in groove portions formed in the organic silicon oxide film 14, with a Nb film 15 interposed as a liner material. These components constitute the wiring structure of a fourth layer.

Likewise, a FSG film 17 is formed on the organic silicon oxide film 14 and the Al wirings 16. An organic silicon oxide film 18 having a carbon concentration of 20 wt % is formed on the FSG film 17. Also, Al wirings 20 having a film thickness of 1.5 $\mu$m are formed in groove portions of the organic silicon oxide film 18. These components constitute the wire structure of a fifth layer.

Next, a method for manufacturing a semiconductor device according to the present embodiment will be explained with reference to cross-sectional views in manufacturing steps shown in FIGS. 6A to 6E.

Figure 6A:
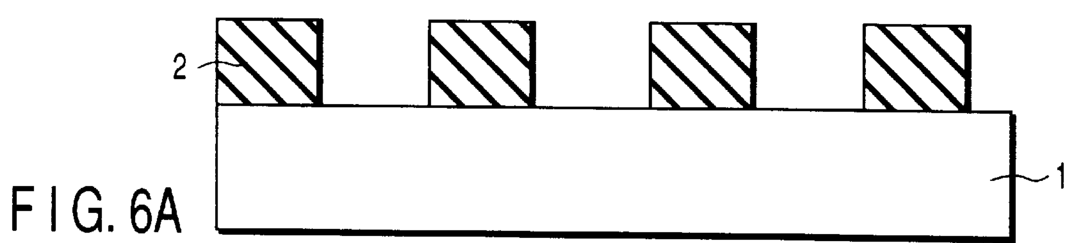
FIGS. 6A to 6E are cross-sectional views of steps, showing a method for manufacturing a semiconductor device, according to the embodiment.

At first, as shown in FIG. 6A, a plasma CVD method is used to form a P—$SiO_2$ film 1, and elements such as transistors not shown are formed in the P—$SiO_2$ film 1. Next, on the P—$SiO_2$ film 1, methyl polysiloxane dissolved in a solvent is applied with use of a coater. After the coating, a heat treatment is carried out to form an organic silicon oxide film 2 with a thickness of 500 nm. The heat treatment is carried out at 80° C. for one minute, at 200° C. for one minute, and at 450° C. for 30 minutes, in this order. An organic silicon oxide film which will be formed in a later step is manufactured by the same method as described, except that only the carbon application rate is different. Next, an anti-reflection film (ARL) and a resist which are not shown are coated and developed. Further, a RIE method is used to form groove portions for wirings such that the P—$SiO_2$ film is exposed.

Figure 6B:
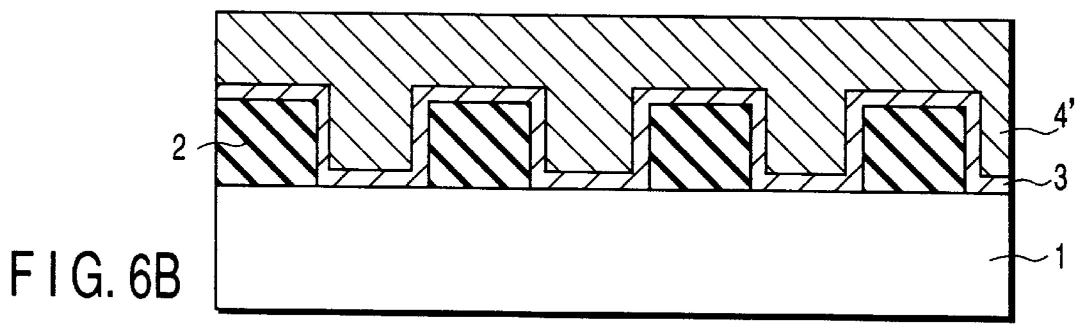

Next, as shown in FIG. 6B, a Nb film 3 is formed with a thickness of 15 nm on the surface of the organic silicon oxide film 2, including the side and bottom surfaces of the groove portions, by sputtering. Further, Al sputtering is performed with a film thickness of 400 nm at the groove portions coated with the Nb film 3, while heating the substrate at 450° C., thereby to burry Al 4' in the groove portions.

Figure 6C:
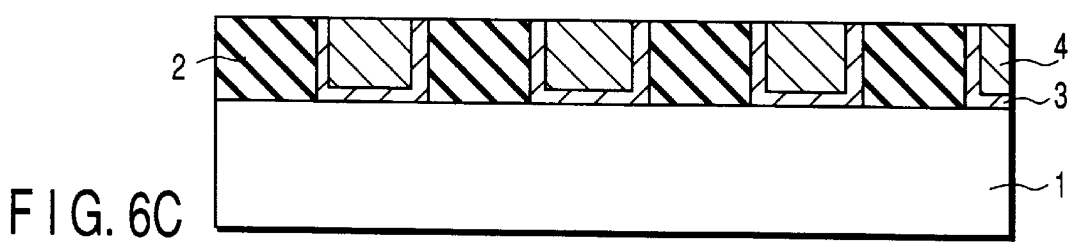

Further, as shown in FIG. 6C, those portions of the Al 4' and Nb film 3 that are formed at other regions than the groove portions are removed with use of a flattening technique such as CMP or the like, thereby to form Al wirings 4 in the first layer.

Figure 6D:
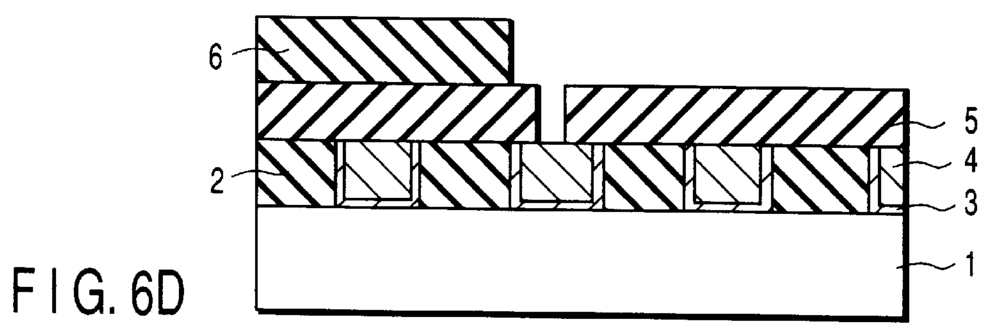

Next, as shown in FIG. 6D, a silicon oxide film added with fluorine by a plasma CVD method, i.e., a FSG film 5 as an inter-layer insulating film is formed. An organic silicon oxide film 6 having a carbon concentration of 22 wt % is formed on the FSG film 5. Further, the organic silicon oxide film 6 and the FSG film 5 are removed such that the Al wirings 4 formed in the organic silicon oxide film 2 are exposed, thereby to form contact holes for making contact with the Al wirings 4 in the first layer. At the same time when these holes are formed, the organic silicon oxide film 6 is removed to form groove portions for wirings so as to overlap these holes.

Figure 6E:
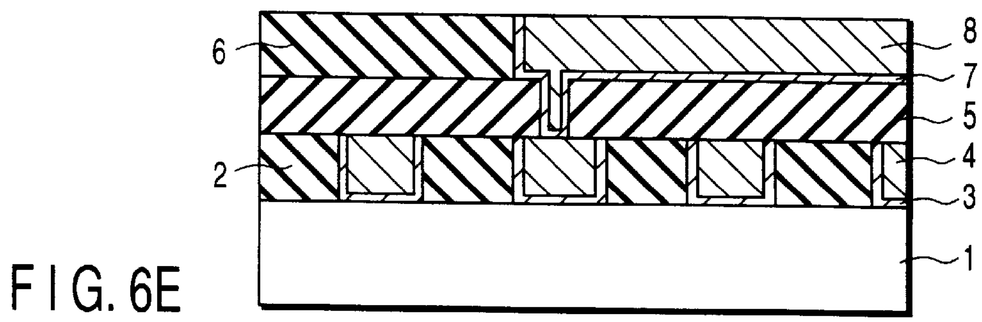

Next, as shown in FIG. 6E, Al is filled in the same manner as the case of the Al wirings 4 in the first layer, and the surface is subjected to CMP processing. In this manner, Al wirings 8 in the second layer are formed on the bottom and side surfaces, with a Nb film 7 with a thickness of 15 nm interposed therebetween.

The steps described above are repeated to form third-layer Al wirings 12 having a film thickness of 500 nm which are buried in an organic silicon oxide film 10 having a carbon concentration of 20 wt % on a FSG film 9 with a Nb film 11 having a thickness of 15 nm interposed therebetween, fourth-layer Al wirings 16 having a film thickness of 1 μm which are buried in an organic silicon oxide film 14 having a carbon concentration 20 wt % on a FSG film 13 with a Nb film 15 having a film thickness of 15 nm interposed therebetween, and fifth-layer Al wirings 20 having a film thickness of 1.5 μm which are buried in an organic silicon oxide film 18 having a carbon concentration 22 wt % on a FSG film 17 with a Nb film 19 having a film thickness of 15 nm interposed therebetween.

Thus, according to the present embodiment, in a wiring layer structure comprised of five layers, the insulating film formed between the wirings each other in one wiring layer is arranged to have a lower carbon concentration than the insulating film formed between the wirings each other in a lower wiring layer. In this manner, the mechanical strength of the insulating film having a larger thickness is increased so that the mechanical strength of the entire multilayer wirings can be increased. Accordingly, it is possible to prevent occurrence of cracking in case of using an organic silicon oxide film as an inter-layer insulating film.

Figure 1:
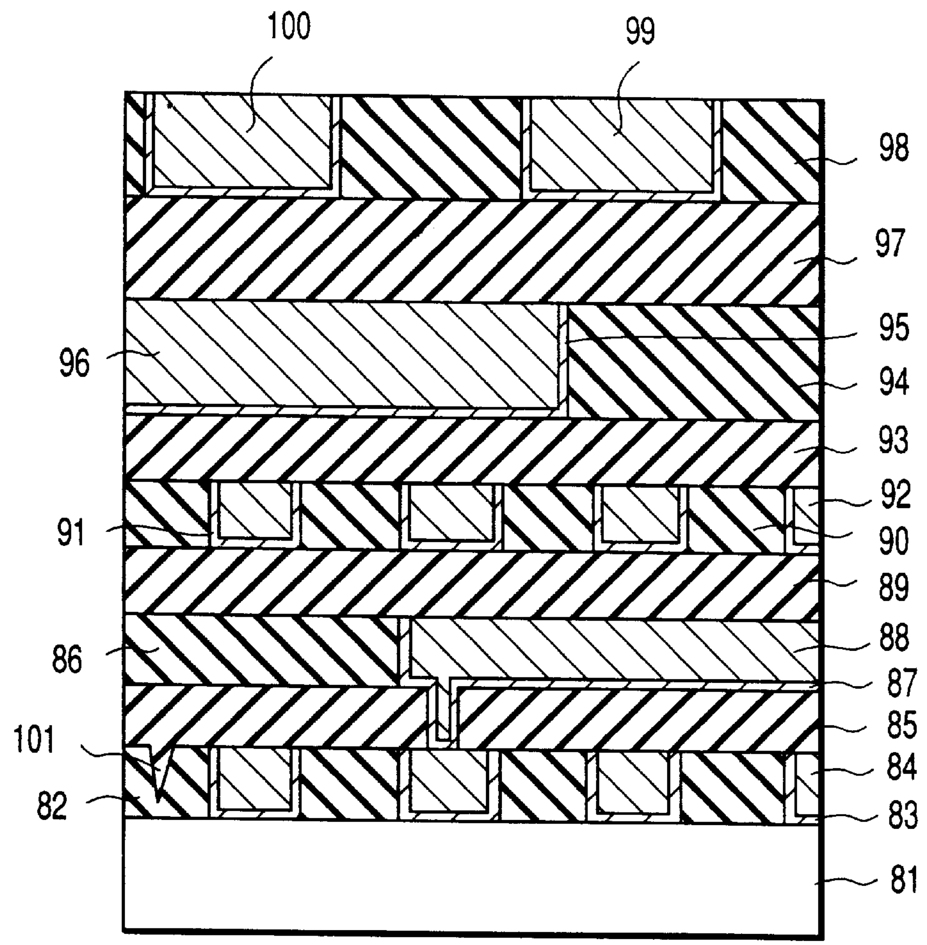
FIG. 1 is a view showing an example of a cross-sectional view of a semiconductor device having a conventional multilayer wiring structure.
Figure 2:
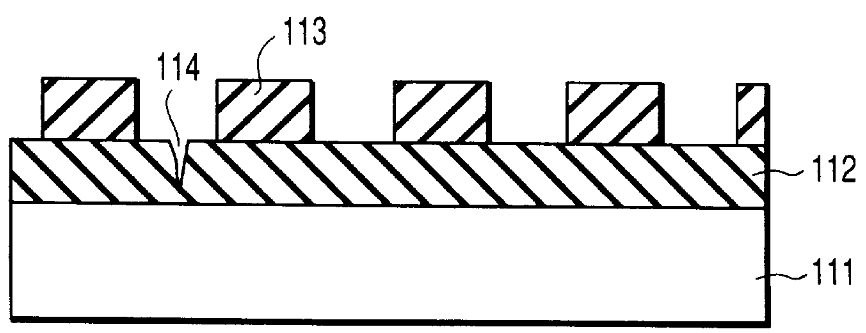
FIG. 2 is a view showing an example of a cross-sectional view of a semiconductor device having a conventional wiring structure.
Figure 3:
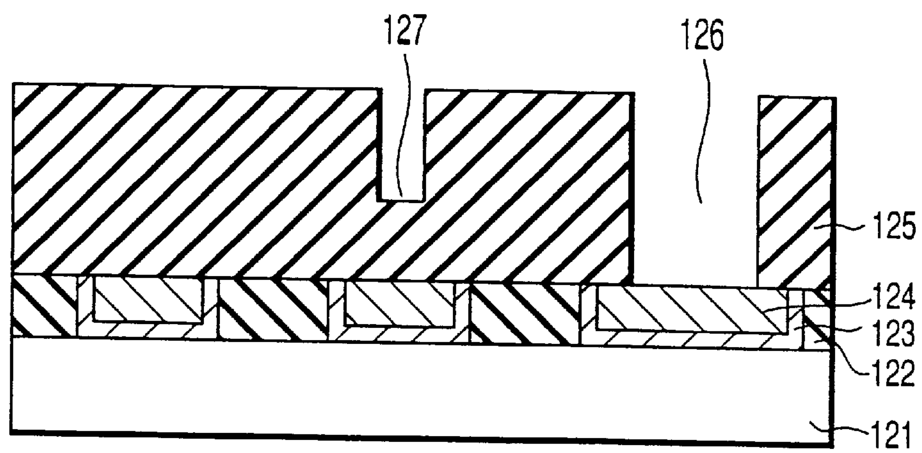
FIG. 3 is a view showing an example of a cross-sectional view of a semiconductor device having a conventional wiring structure.
Figure 4:
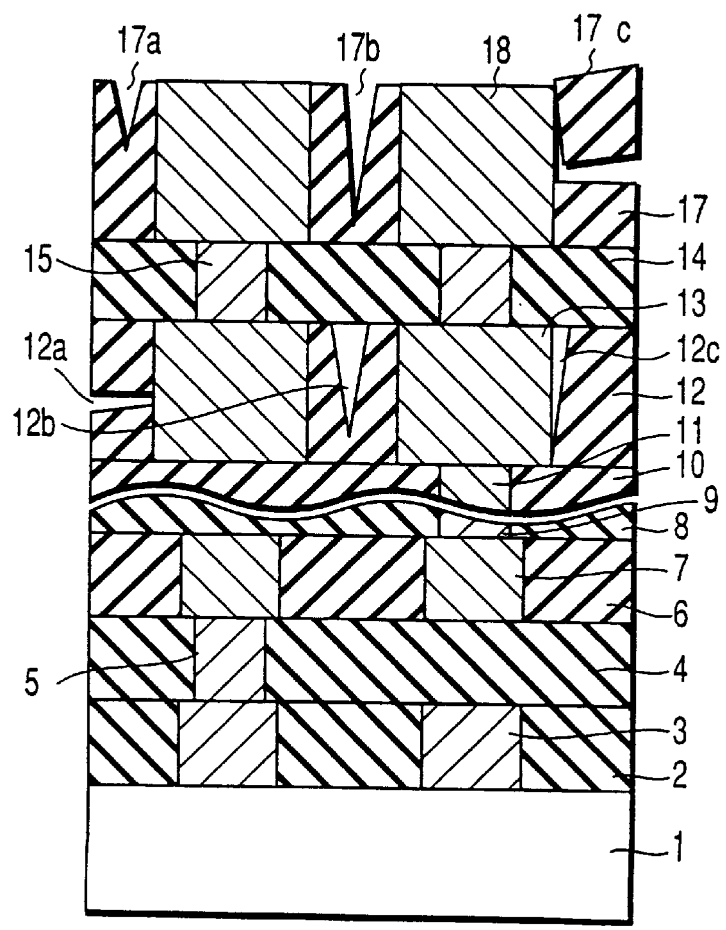
FIG. 4 is a view showing a problem of a semiconductor device having a conventional multi-wiring structure.

In a conventional apparatus structure, i.e., in a wiring structure comprised of five layers as shown in FIG. 1, cracking appears in insulating films near wirings in a lower layer if the carbon concentrations of the insulating films formed between wirings in each wiring layer are equal to each other. However, cracking does not occur in a multilayer wiring structure manufactured by a method shown in the present embodiment.

Although the present embodiment uses an organic silicon oxide film which does not contain metal oxide, similar advantages can be obtained even if metal oxide is contained. Also, according to the present embodiment, an organic silicon oxide film is formed with use of a coating method. If organic silicon oxide films having different carbon concentrations are formed by a CVD method using trimethylsilane, tetramethylsilane, oxygen, and the like for a raw material gas, similar advantages are obtained.

Further, in the present embodiment, the carbon concentration of insulating films formed between wirings in one wiring layer is higher than the carbon concentration of insulating films formed between wirings in a lower wiring layer. However, the present invention is not limited hitherto. The carbon concentration of insulating films formed between wirings in a lower wiring layer may be lower than the carbon concentration of insulating films formed between wirings in an upper wiring layer. In the present embodiment, the wiring width and the film thickness increase gradually toward the uppermost layer. However, increase and decrease of the carbon concentrations in upper and lower wiring layers can be changed depending on the width of wirings in each layer, the film thickness, or the like.

Second Embodiment

Figure 7:
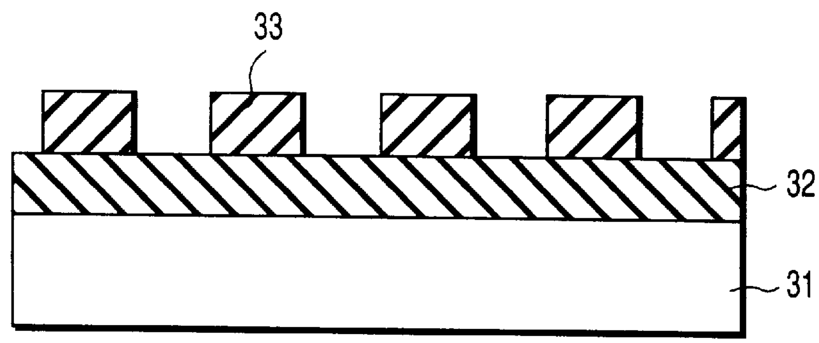
FIG. 7 is a cross-sectional view showing the entire structure of a semiconductor device according to the second embodiment of the present invention.

FIG. 7 shows the entire structure of a semiconductor device according to the second embodiment of the present invention. As shown in FIG. 7, an organic silicon oxide film 32 having a $TiO_2$ concentration of 5 wt % and a carbon concentration of 22 wt % is formed with a film thickness of 500 nm on a BPSG film 31 where elements such as transistors not shown are formed. Further, an organic silicon oxide film 33 having a $TiO_2$ concentration of 0.1 wt % and a carbon concentration of 22 wt % is formed on the organic silicon oxide film 32. Groove portions for wirings is formed in the organic silicon oxide film 33.

A method of manufacturing a semiconductor device according to the above embodiment will be explained.

After forming elements and the like in the BPSG film 31, organic silicon oxide films 32 and 33 are formed to be layered on the BPSG film 31. To form these organic silicon oxide films 32 and 33, methylpolysiloxane dissolved in a solvent is coated with use of a coater and is thereafter subjected to a heat treatment in a $N_2$ atmosphere. The heat treatment is performed at 80° C. for one minute, at 200° C. for one minute, and at 450° C. for 30 minutes in this order.

Next, an anti-reflection film (ARL) and a resist are coated on the organic silicon oxide films and developed. Further, the groove portions are processed with use of a RIE method, and thereafter, the anti-reflection film and the resist are removed by the RIE method using a $O_2$ gas. As a result, groove portions for wirings as shown in FIG. 7 are formed. Subsequently, reflow, CMP, and the like of Al are carried out by the same method as used in the first embodiment. As a result, first Al wirings not shown are formed in the groove portions.

Thus, according to the present embodiment, the $TiO_2$ concentration of the insulating films formed under a wiring layer is set to be higher compared with the $TiO_2$ concentration of the insulating films formed between wirings in one same wiring layer. In this manner, the mechanical strength of the insulating films under a wiring layer can be increased, so it is possible to reduce greatly the occurrence frequency of cracking when peeling a resist used for groove portions of wirings.

In a conventional apparatus structure, i.e., in case where insulating films under wiring layers and insulating films between wirings in one same wiring layer are formed at an equal metal oxide concentration, cracking is caused at the bottom surfaces of wiring groove portions when peeling a resist. However, cracking is not caused in a wiring structure manufactured by the method shown in the present embodiment.

Although the present embodiment shows a case in which the metal oxide concentration of the organic silicon oxide film 32 is set to be higher compared with the $TiO_2$ concentration of the organic silicon oxide film 33, the present invention is not limited hitherto. The metal oxide concentration can be variously change in accordance with the wiring width and the wiring film thickness. For example, the metal oxide concentration in the organic silicon oxide film 32 side may be lowered. Also, organic silicon oxide films may be formed by a CVD method or the like in place of the coating method.

Third Embodiment

Figure 8:
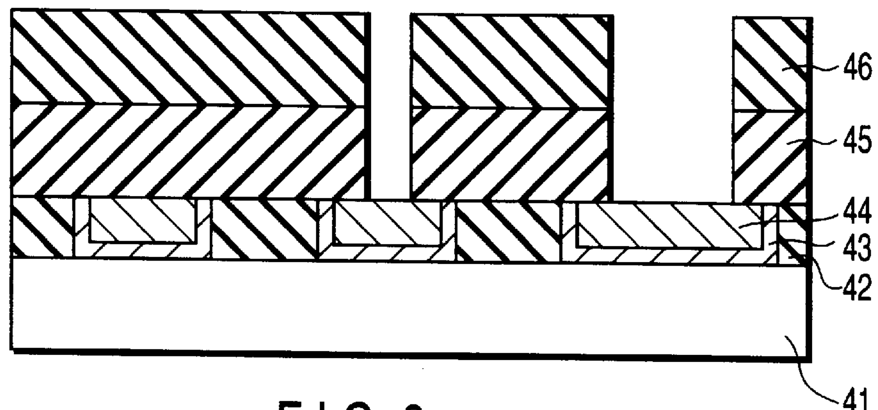
FIG. 8 is a cross-sectional view showing the entire structure of a semiconductor device according to the third embodiment of the present invention.

FIG. 8 shows the entire structure of a semiconductor device according to the third embodiment of the present invention. The reference 41 denotes a P—$SiO_2$ film where elements such as transistors not shown and the like are formed, i.e., a $SiO_2$ film formed by a plasma CVD method. An organic silicon oxide film 42 having a carbon concentration of 22 wt % and a film thickness of 500 nm is formed on the P—$SiO_2$ film 41. Groove portions are formed in the organic silicon oxide film 42. A Nb film 43 having a film thickness of 15 nm is formed as a liner material on the side walls and the bottom surfaces of the groove portions. Further, Al wirings 44 are formed in the groove portions. These components constitute the wiring structure of a first layer.

As an inter-layer insulating film, silicon oxide films 45 and 46 are formed on the silicon oxide film 42 and the Al wirings 4. The organic silicon oxide films 45 and 46 have respectively carbon concentrations of 16 wt % and 20 wt %. Holes for making contact with the Al wirings 44 as wirings in a first layer are formed in the organic silicon oxide films 45 and 46.

A method for manufacturing a semiconductor device according to the present embodiment will now be explained.

An organic silicon oxide film 42 is formed on a P—$SiO_2$ film 41. Groove portions are formed in the organic silicon oxide film 42. Further, the steps until a Nb film 43 and Al wirings 44 are formed are the same as those in the first embodiment.

Next, an organic silicon oxide film 45 having a carbon concentration 16 wt % is formed with a film thickness of 500 nm on the organic silicon oxide film 42 and the Al wirings 44. Thereafter, an organic silicon oxide film 46 having a carbon concentration of 20 wt % is further formed with a film thickness of 500 nm on the organic silicon oxide film 45. To form these organic silicon oxide films 45 and 46, methylpolysiloxane dissolved in a solvent is coated with use of a coater and is thereafter subjected to a heat treatment in a $N_2$ atmosphere. The heat treatment is performed at 80° C. for one minute, at 200° C. for one minute, and at 450° C. for 30 minutes in this order.

Next, an anti-reflection film (ARL) and a resist are coated. Further, the groove portions are processed with use of RIE, and thereafter, the anti-reflection film and the resist are removed by a RIE method using a $O_2$ gas. As a result, fine holes of 0.175 $\mu$m are formed.

Subsequently, in the same method as used in the first embodiment, an insulating film is formed on the organic silicon oxide films 45 and 46 as inter-layer insulating films. Groove portions for wirings are formed in this insulating film. Further, reflow, CMP, and the like of Al are carried out thereby to form second wirings.

Thus, according to the present embodiment, the inter-layer insulating films are constructed in a layer structure including layers having different carbon concentrations, and the carbon concentration of the lower layer side is set to be lower than that of the upper layer side. Therefore, without using a layer structure including an organic silicon oxide film and an inorganic film as shown in the first embodiment, etch-stop does not occur in the lower layer side but etching can be sufficiently achieved so as to reach the Al wirings 44 in a lower layer.

In case of a conventional apparatus structure, i.e., in case where insulating films between wiring layers and insulating films between wirings in one same wiring layer have an equal carbon concentration, etch-stop appears when forming fine holes 127 during the etching which is performed when forming contact holes in the organic silicon oxide film 125 on the Al wirings 124. However, in case of the present embodiment, the holes sufficiently penetrate the Al wirings 44 in the lower layer so that sufficient holes are formed.

The present embodiment uses a layer structure comprising two organic silicon oxide films 45 and 46 which have different carbon concentrations. However, if inter-layer insulating films whose carbon concentrations change sequentially are used, similar advantages can be attained. Also, similar advantages are obtained in a structure in which a thin silicon nitride film or a silicon oxide film having a film thickness of 50 to 100 nm is interposed between two organic silicon oxide films 45 and 46. In addition, the present embodiment uses an organic silicon oxide film containing no metal oxide, as an inter-layer insulating film. However, similar advantages are obtained even if an oxide film containing metal oxide is used.

Although the present embodiment uses a coating method to form organic silicon oxide films, the present invention is not limited hitherto. Similar advantages are obtained if organic silicon oxide films having different carbon concentrations are formed by a CVD method in which trimethylsilane, tetramethylsilane and oxygen, or the like is used as a raw material gas.

In addition, the present embodiment shows a case where a layer structure comprised of inter-layer insulating films having different carbon concentrations are formed on the wirings in the first layer. However, the present invention is not limited hitherto. In case where a layer structure comprised of inter-layer insulating films having different carbon concentrations is provided on a wiring in an n-th layer, the advantages of the present invention can be achieved. Also, the above case shows that the carbon concentration in the upper layer is set to be higher than that of the lower layer in the layer structure of inter-layer insulating films. However, the carbon concentrations may be set inversely between the upper and lower layers, and the concentrations are not limited to those indicated in the present embodiment.

Fourth Embodiment

Figure 9:
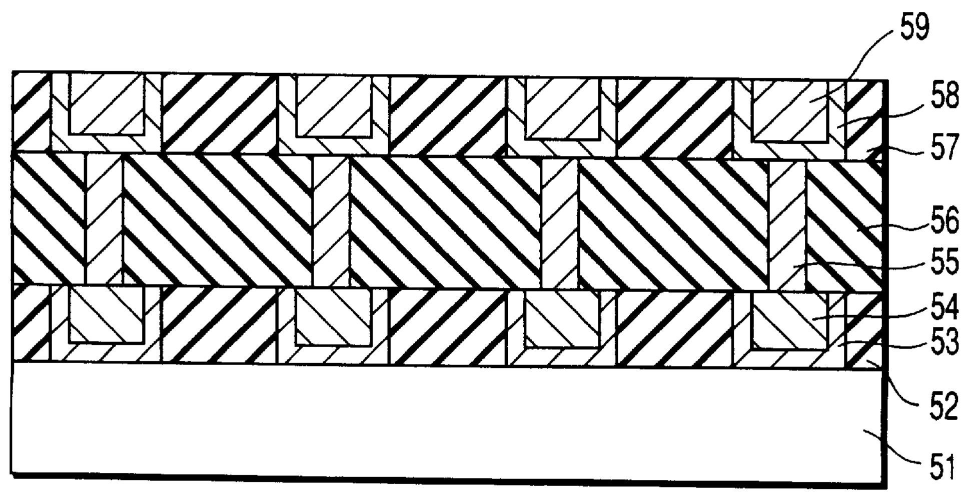
FIG. 9 is a cross-sectional view showing the entire structure of a semiconductor device according to the third embodiment of the present invention.

FIG. 9 shows the entire structure of a semiconductor device according to the fourth embodiment of the present invention. The reference 51 denotes a P—$SiO_2$ film where elements such as transistors not shown and the like are formed. An organic silicon oxide film 52 having a carbon concentration of 18 wt % is formed on the P—$SiO_2$ film 51. Groove portions are formed in the organic silicon oxide film 52. A Nb film 53 having a film thickness of 15 nm is formed as a liner material on the groove portions and the bottom surfaces. Further, Al wirings 54 are formed in the groove portions with the Nb film 53 interposed therebetween, thus constructing the wiring structure of a first layer.

Pillars 55 made of Al are formed on the Al wirings 54, and an organic silicon oxide film 56 having a carbon concentration of 22 wt % is formed as an inter-layer insulating film with a film thickness of 500 nm, so as to cover the side portions of the pillars 55. Further, an organic silicon oxide film 57 having a carbon concentration of 18 wt % is formed on the organic silicon oxide film 56. Groove portions are formed in the organic silicon oxide film 57, al wirings 59 are formed on in the groove portions, with a Nb film 58 as a liner material inserted on the side walls and the bottom surfaces, thus constructing the wiring structure of a second layer. The Al wirings 54 in the first layer and the Al wirings 59 in the second layer are connected with each other by the pillars 55.

A method for manufacturing a semiconductor device according to the present embodiment will now be explained with reference to FIGS. 10A to 10C.

Figure 10A:
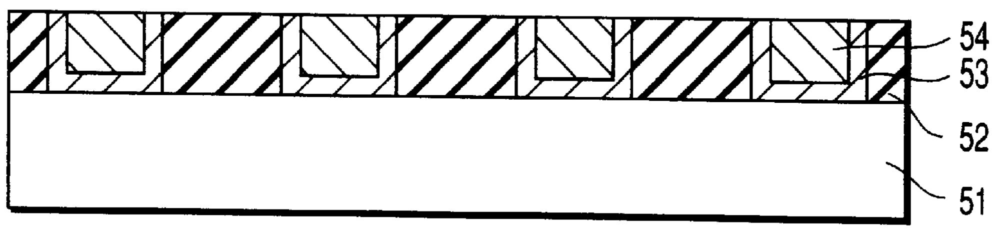
FIGS. 10A to 10C are cross-sectional views of steps, showing a method for manufacturing a semiconductor device according to the embodiment.
Figure 10B:
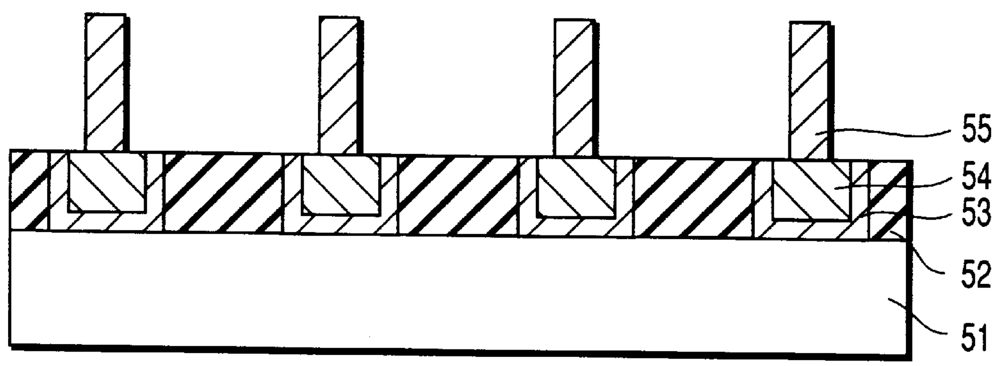
Figure 10C:
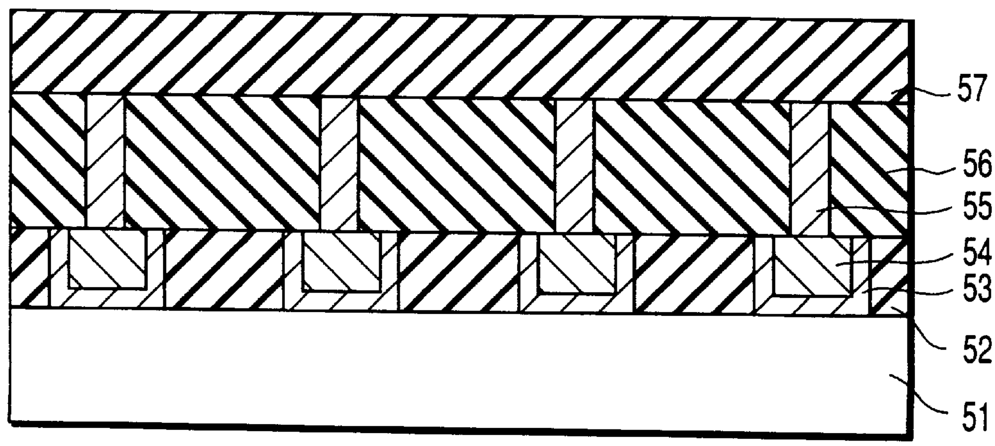

As shown in FIG. 10A, an organic silicon oxide film 42 is formed on a P—$SiO_2$ film 51. Groove portions are formed in the organic silicon oxide film 52. Al wirings 54 are formed in the groove portions. The steps hitherto are the same as those in the first embodiment.

Al is formed on the organic silicon oxide film 52 and the Al wirings 54, and thereafter, an anti-reflection film (ARL) and a resist are coated and developed. Pillars 55 for making contact with the Al wirings 54 in the first layer are formed with use of RIE (FIG. 10B).

Next, an organic silicon oxide film 56 having a carbon concentration of 22 wt % is formed, and the surface thereof is flattened and removed by CMP so as to expose the pillars 55. Further, an organic silicon oxide film 57 having a carbon concentration of 18 wt % is formed on the pillars 55 and the organic silicon oxide film 56 (FIG. 10C).

At last, groove portions are formed in the organic silicon oxide film 57 so as to expose the pillars 55, and Al wirings 59 are formed in the groove portions with a Nb film 58 as a liner material interposed therebetween.

Thus, according to the present embodiment, a pillar process is used to make contact. Therefore, there is no necessity for steps of processing fine holes which cause problems when organic silicon oxide films are used as inter-layer insulating films. Accordingly, inter-layer insulating films can be constructed by a material having a low dielectric constant. Also, since the etching rate depending on RIE decreases as the carbon concentration increases in the organic silicon oxide film, controllability concerning the groove depth in groove processing on wirings can be improved by layering organic silicon oxide films having different carbon concentrations to process grooves for wirings like the present embodiment. Accordingly, it is possible to restrict variants of the resistance of the wirings, which are caused by variants of the groove depths. Further, since the carbon concentration of the organic silicon oxide film 56 is low, the mechanical strength is improved so that resistance against polishing is improved when flattening and removing the organic silicon oxide film 56 formed at the side portions of the pillars.

Note that the carbon concentrations of the organic silicon oxide films 56 and 57 are not limited to those shown in the present embodiment. The high and low carbon concentrations can be changed between both of the films, and the carbon concentrations are not limited to the values shown in the present embodiment but may be variously changed.

As has been specifically described above, according to the present invention, a multilayer wiring structure with high reliability can be provided by using materials having different carbon concentrations, for respective parts of the inter-layer insulating films in the wiring structure.

Fifth Embodiment

Figure 11A:
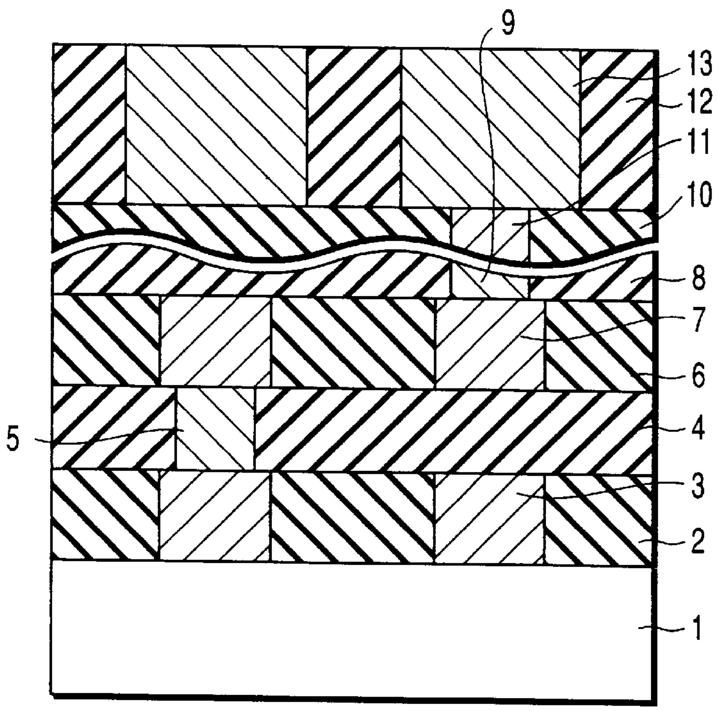
FIGS. 11A to 11E are cross-sectional views of steps, showing a method for manufacturing a semiconductor device according to the fifth embodiment of the present invention.
Figure 11B:
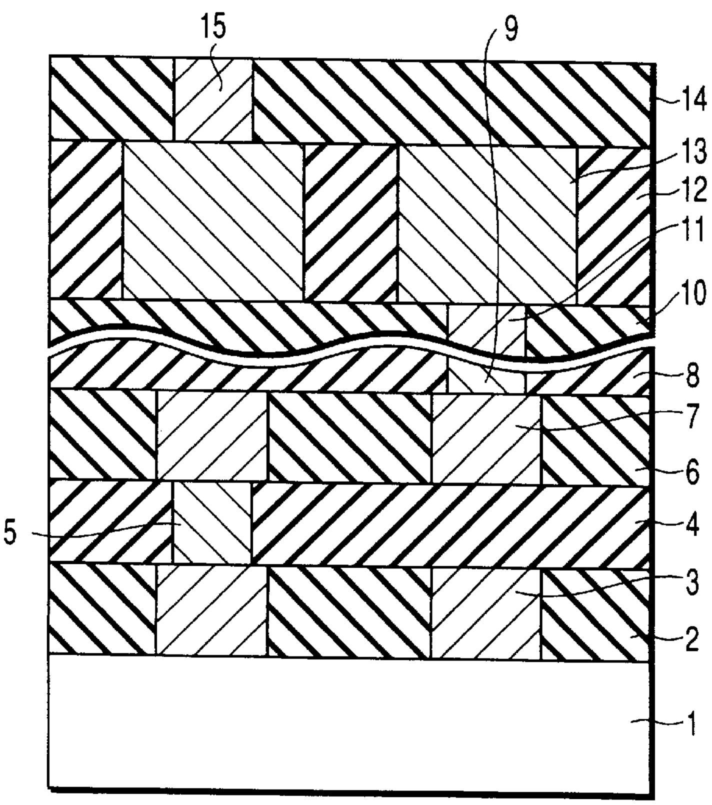
Figure 11C:
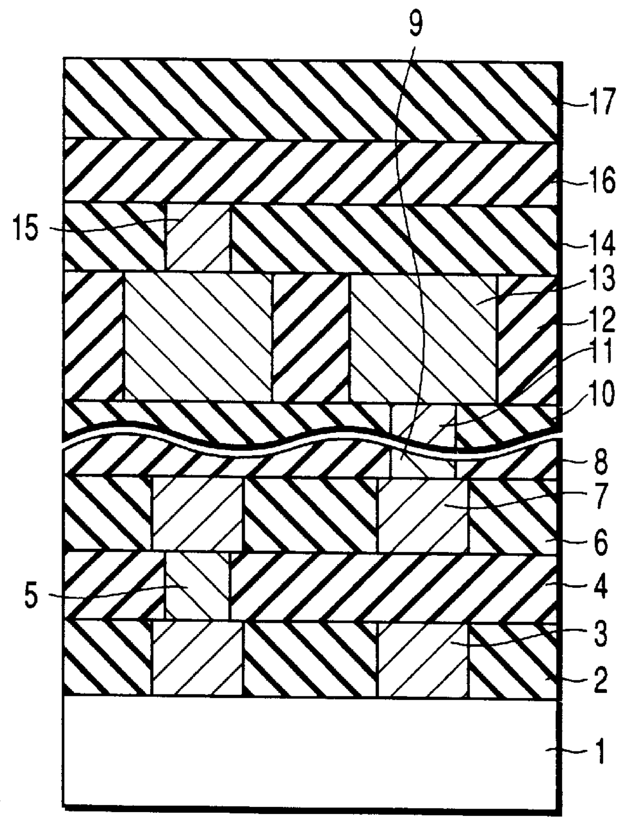

FIGS. 11A to 11E are cross-sectional view showing steps of a method for manufacturing a semiconductor device, according to the fifth embodiment of the present invention. At first, as shown in FIG. 11A, an inter-wiring insulating film 2 is formed on a semiconductor substrate 1 where transistors not shown are formed. Grooves are formed at predetermined positions of the inter-wiring insulating film 2, and a conductive film is formed on the inter-wiring insulating film 2 including the grooves. The conductive film is polished and removed by CMP or the like so as to expose the surface of the inter-wiring insulating film 2, thus forming wirings 3 of the first layer.

Next, an inter-layer insulating film 4 is formed on the inter-wiring insulating film 2 and the wirings 3, and via holes are formed at a predetermined position of the inter-layer insulating film 4. Further, a conductive film is buried in the via holes to form a via plugs 5. Next, an inter-wiring insulating film 6 is formed on the inter-layer insulating film 4 and the via plugs 5, and further, grooves are formed at predetermined positions of the inter-wiring insulating film 6. These grooves are formed, including the position where the via plugs 5 are exposed. Further, a conductive film is formed on the inter-wiring insulating film 6, including these grooves. The other portions of the conductive film than the portions of the grooves are polished and removed by CMP or the like until the surface of the inter-wiring insulating film 6 is exposed. Wirings 7 in the second layer are thus formed. Further, an inter-wiring insulating film 8 is formed, and via plugs 9 are formed at a predetermined position of the film 8. These steps are repeated until wirings 13 of an (n−1)-th layer are formed in the grooves of an inter-wiring insulating film 12.

Next, an inter-layer insulating film 14 is formed on the inter-wiring insulating film 12 and the wirings 13 of an (n−1)-th layer. Further, via holes are formed in the inter-layer insulating film 14 such that a part of the wirings 13 of the (n−1)-th layer is exposed. Further, a conductive film is formed on the inter-layer insulating film 14, including these holes. The other portions of the conductive film than the holes are polished and removed by CMP or the like until the inter-layer insulating film 14 is exposed. Via plugs 15 are thus formed.

Next, to form Damascene wirings of an n-th layer, a first inter-wiring insulating film 16 and a second inter-wiring insulating film 17 are sequentially layered on the inter-layer insulating film 14.

An organic insulating film in which dangling bond as a film component is ended by a methyl group or an ethyl group is used as the first inter-wiring insulating film 16. An insulating film deposited by a chemical vapor deposition (CVD) method is used as the second inter-wiring insulating film 17. Between the first and second inter-wiring insulating films 16 and 17 made of these materials, both of the film stress and the film hardness differ. The stress effected on the first inter-wiring insulating film 16 and the stress effected on the second inter-wiring insulating film 17 act in direction opposite to each other.

The film stress is defined by the following equation (2) taking an example of a stress $\sigma_f$ which is caused in case where a thin film made of $SiO_2$ is formed on a Si substrate.

$$\sigma_f = E_s/6(1-\nu)\cdot d_s^2/(d_f\cdot a) \quad (2)$$

In this expression, $\nu$ is a Poisson ratio of the Si substrate, and $E_s$ is a Young's modulus, $d_s$ is the thickness of the Si substrate, a is a radius of curvature, and $d_f$ is the thickness of a thin film.

Also, the film hardness is micro Vickers hardness $H_v$, and is generally defined as $Hv=(2F\cdot\sin 136°/2)/d^2$ in a fine hardness test using a Vickers indenter of an equilateral rectangular pyramid having a face angle of 136° where the diagonal length of the bottom face of the indenter is d and the force applied to the indenter is F.

Figure 11D:
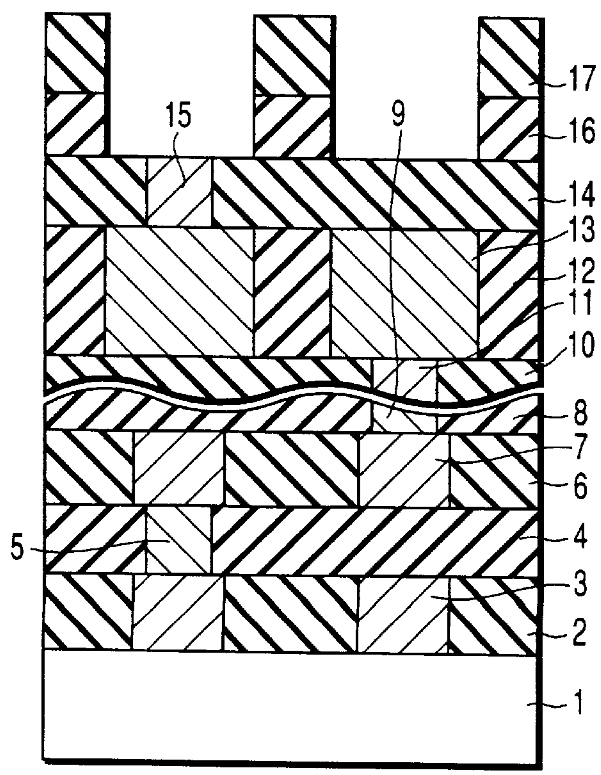
Figure 11E:
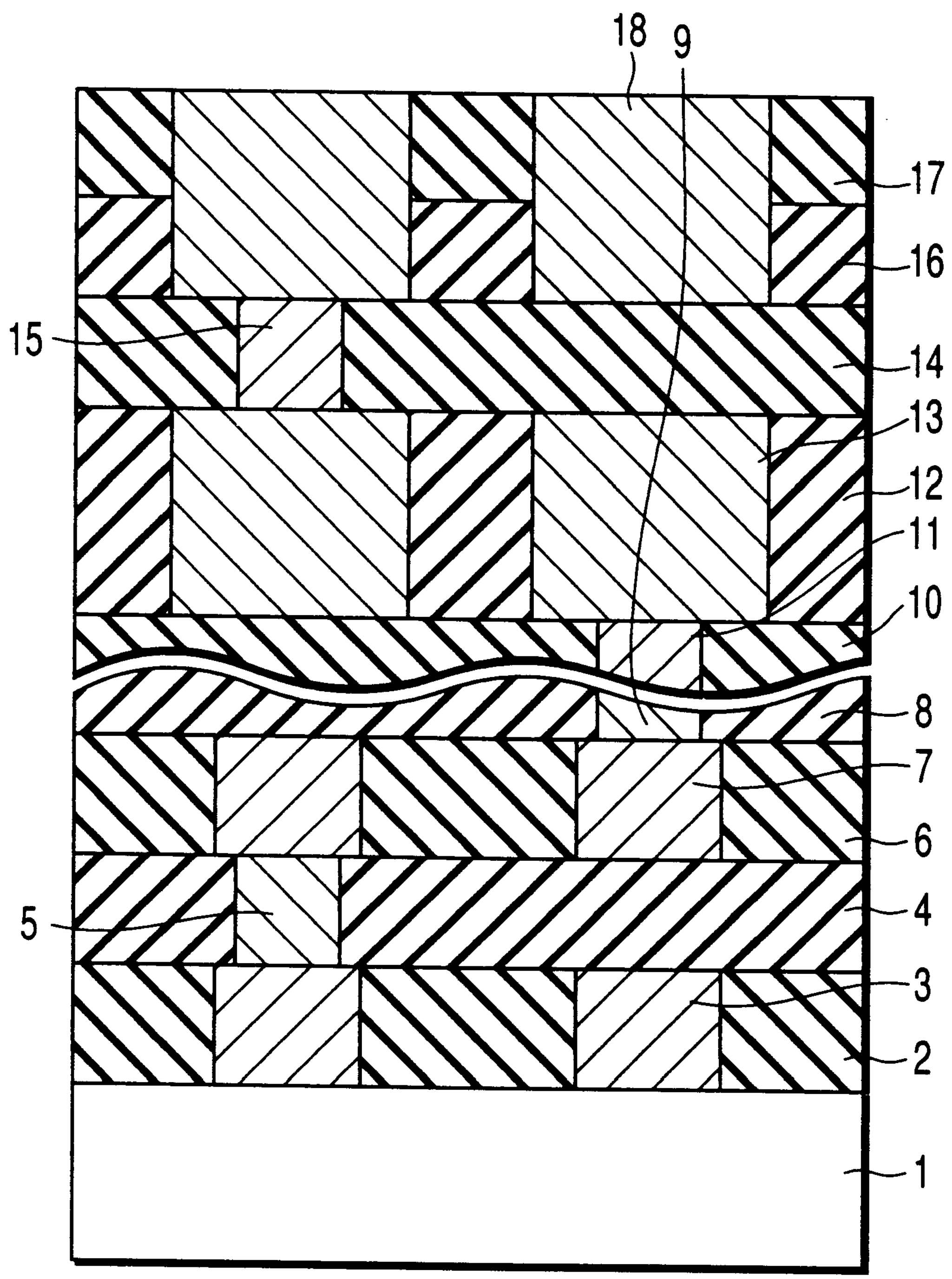

Next, as shown in FIG. 11D, grooves are formed in the first and second inter-wiring insulating films 16 and 17 so as to expose via plugs 15. Further, a conductive film is formed on the first and second inter-wiring insulating films 16 and 17, including these grooves. The other portions of the conductive film than the groove portions are polished and removed by CMP or the like until the second inter-wiring insulating film 17 is exposed, thereby to form wirings in the n-th layer 18. By the above steps, a semiconductor device having a wiring structure of n layers is completed, as shown in FIG. 11E.

Thus, according to the present embodiment, the inter-wiring insulating films of the uppermost layer which has the largest wiring width and wiring film thickness are constructed in a layer structure comprised of insulating films between which the film stress and the film hardness differ. Materials of the inter-wiring insulating films are selected such that stresses effected on the insulating films thus layered respectively effect in directions opposite to each other. In this manner, a multilayer wiring structure which does not cause cracking or peeling even in the inter-wiring insulating films at the wiring portions in the uppermost layer. In addition, since an organic insulating film having a low dielectric constant is used as the first insulating film 16 and a CVD insulating film having high film hardness is used as the second inter-wiring insulating film, not only the problem of film stress is avoided but also the wiring capacity can be reduced. In particular, an insulating film having a relative dielectric constant of 3 or less should preferably be used as the first inter-wiring insulating film 16.

Sixth Embodiment

FIGS. 12A to 12I are cross-sectional views showing steps of a method for manufacturing a semiconductor device, according to the sixth embodiment of the present invention. In the following embodiment, the portions common to the fifth embodiment will be referred to common reference symbols, and detailed explanation thereof will be omitted herefrom.

Figure 12A:
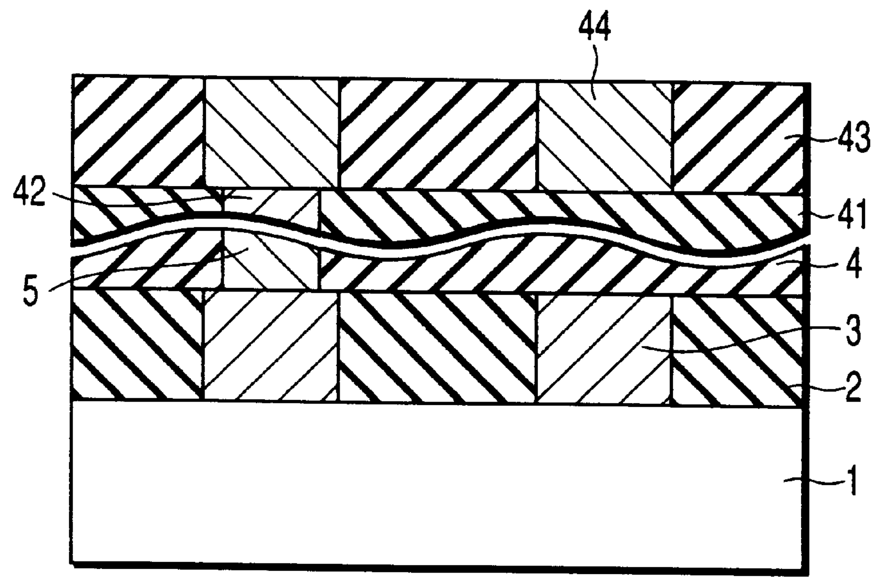
FIGS. 12A to 12I are cross-sectional views of steps, showing a method for manufacturing a semiconductor device according to the sixth embodiment of the present invention.

As shown in FIG. 12A, first layer wirings 3 are formed between inter-wiring insulating films 2 on a semiconductor substrate 1, with use of Damascene process like the fifth embodiment. Steps of this kind are repeated so that formation up to (n−2)-th layer wirings 44 connected to the via plugs 42 is carried out.

Figure 12B:
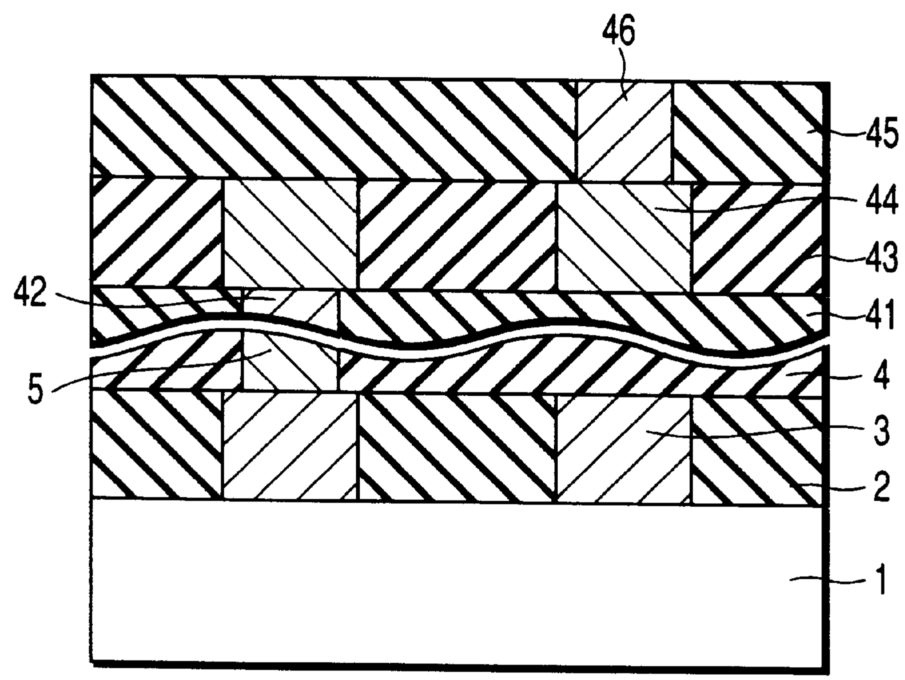

Next, as shown in FIG. 12B, an inter-layer insulating film 45 is formed on the inter-wiring insulating film 43 and the (n−2)-th layer wirings 44. Thereafter, via holes are opened at a predetermined position where a part of the (n−2)-th layer wirings 44 is exposed. Via plugs 46 are formed by burying a conductive film in this opening portion.

Figure 12C:
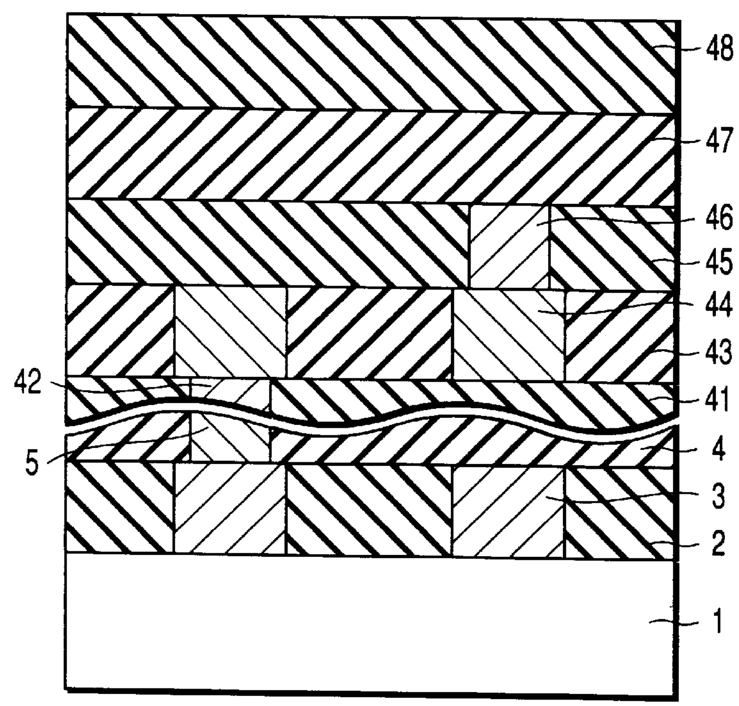

Next, to form Damascene wirings of the (n−1)-th layer, a first inter-wiring insulating film 47 and a second inter-layer insulating film 48 are sequentially formed and layered on the inter-layer insulating film 45, as shown in FIG. 12C. These first and second inter-wiring insulating films 47 and 48 respectively use the same materials as those of the first and second inter-wiring insulating films 16 and 17 shown in the fifth embodiment.

Figure 12D:
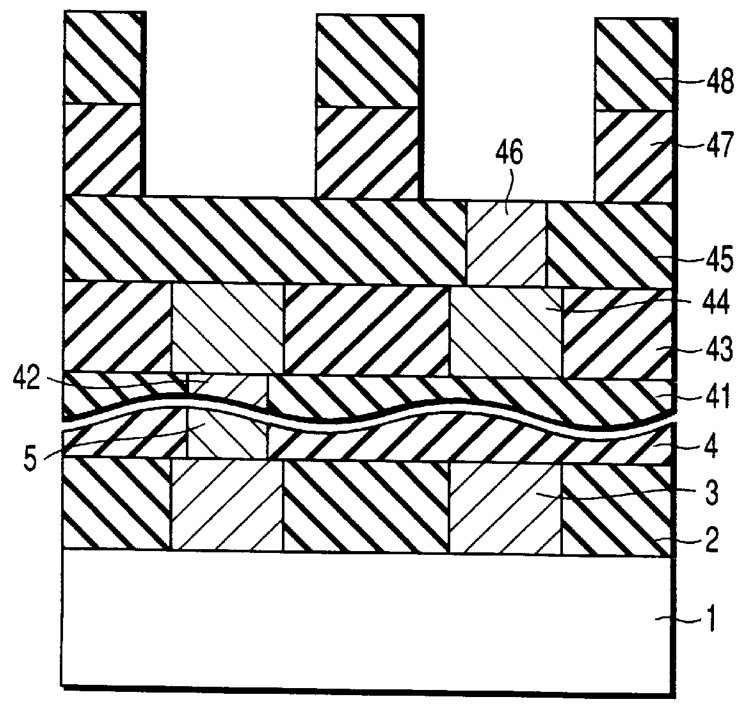
Figure 12E:
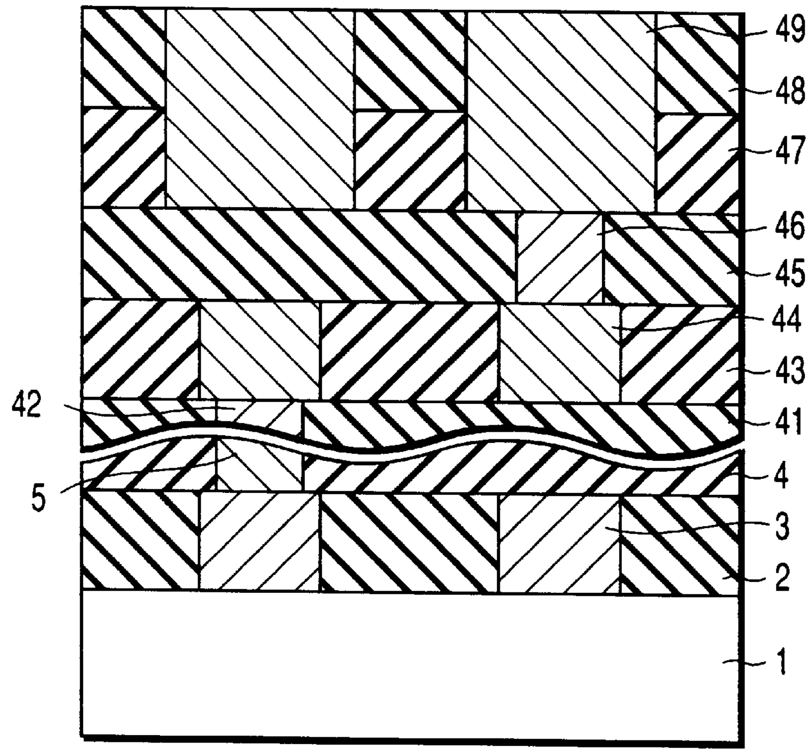

Next, as shown in FIG. 12D, grooves for Damascene wirings are formed in the first and second inter-wiring insulating films 47 and 48 so as to expose the via plugs 46. A conductive film is formed on the second inter-wiring insulating film 48, including these grooves. The other portions of the conductive film than the groove portions are polished and removed to form (n−1)-th layer wirings 49 in the grooves (FIG. 12E).

Figure 12F:
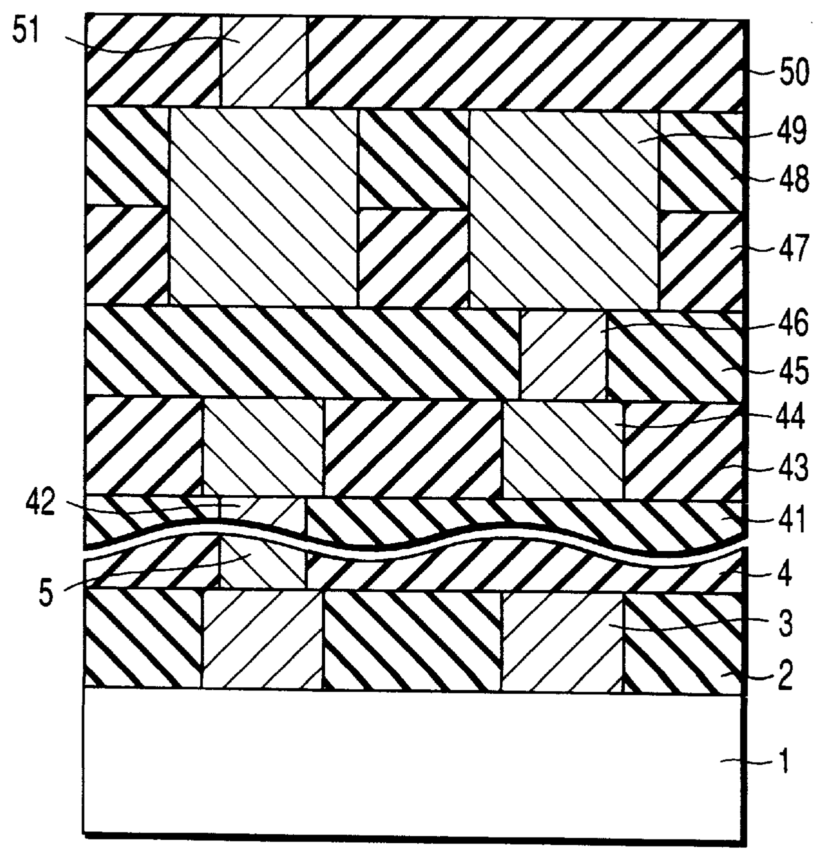
Figure 12G:
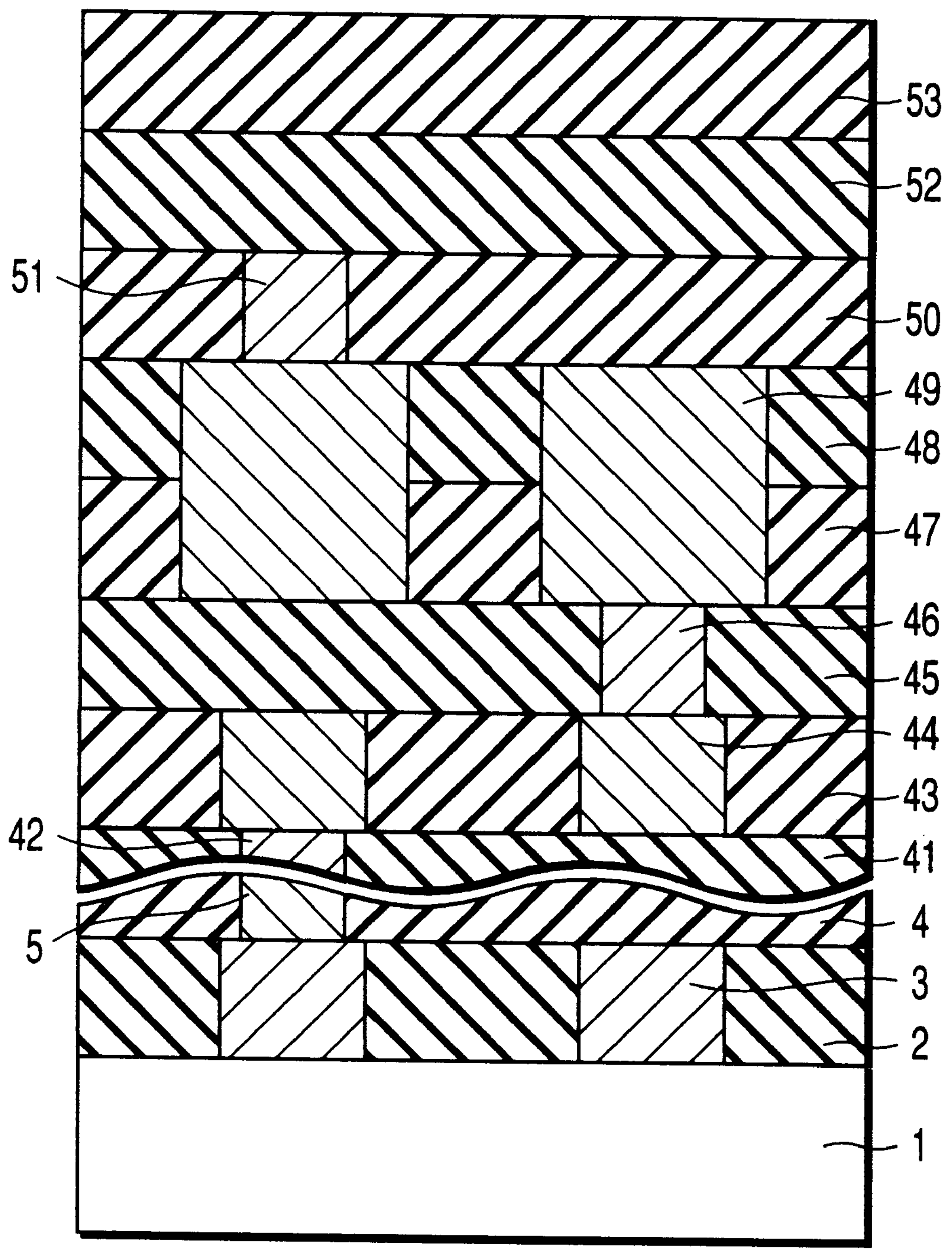

Next, as shown in FIG. 12F, an inter-layer insulating film 50 is formed on the (n−1)-th layer wirings 49 and the second inter-wiring insulating film 48, and thereafter, via holes are opened. A conductive film is buried in these via holes thereby to form via plugs 51.

Next, to form Damascene wirings of the n-th layer, a third inter-wiring insulating film 52 and a fourth inter-wiring insulating film 53 are sequentially formed and layered. The third and fourth inter-wiring insulating films 52 and 53 respectively use the same materials as those of the first and second inter-wiring insulating films 16 and 17 shown in the fifth embodiment.

Figure 12H:
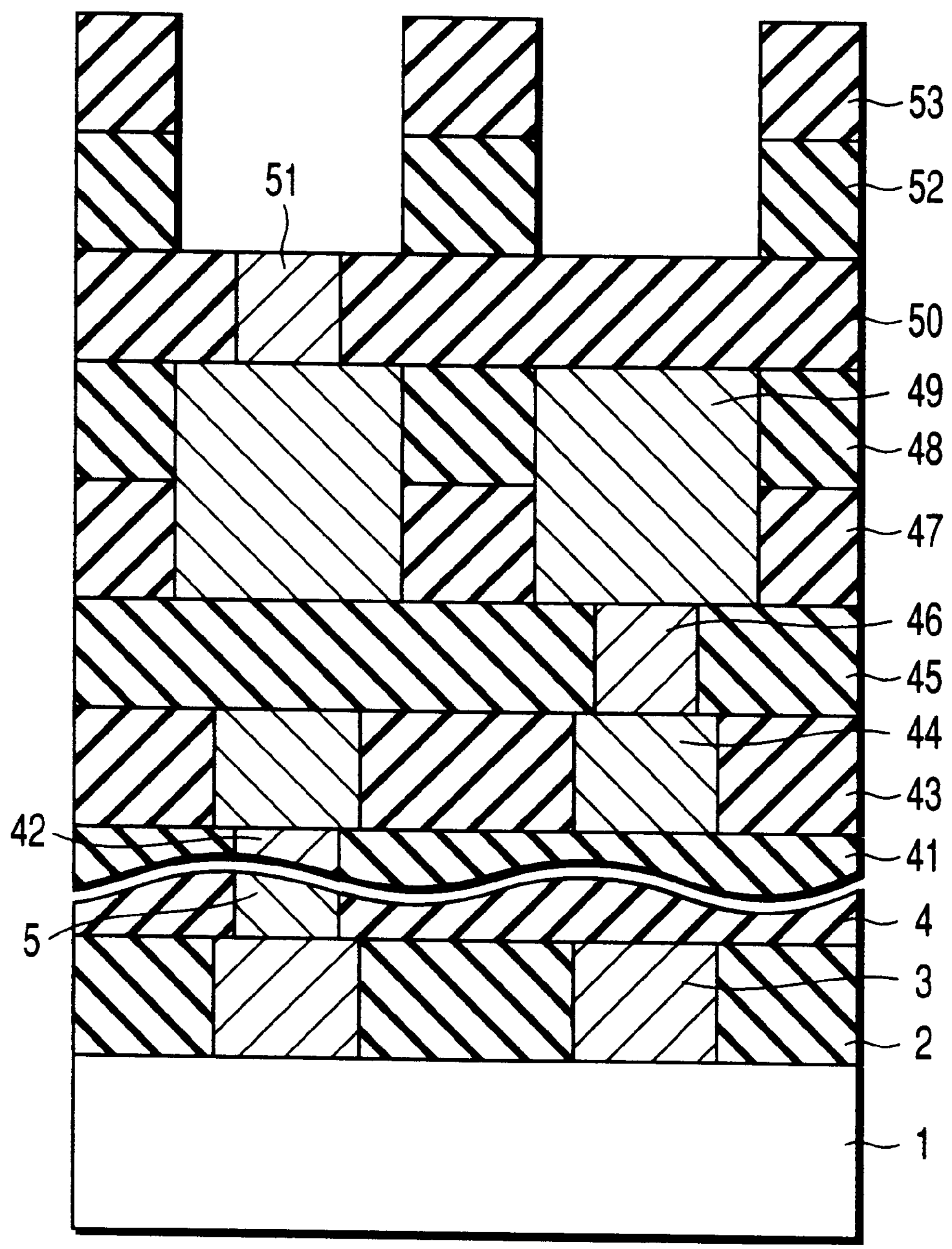
Figure 12I:
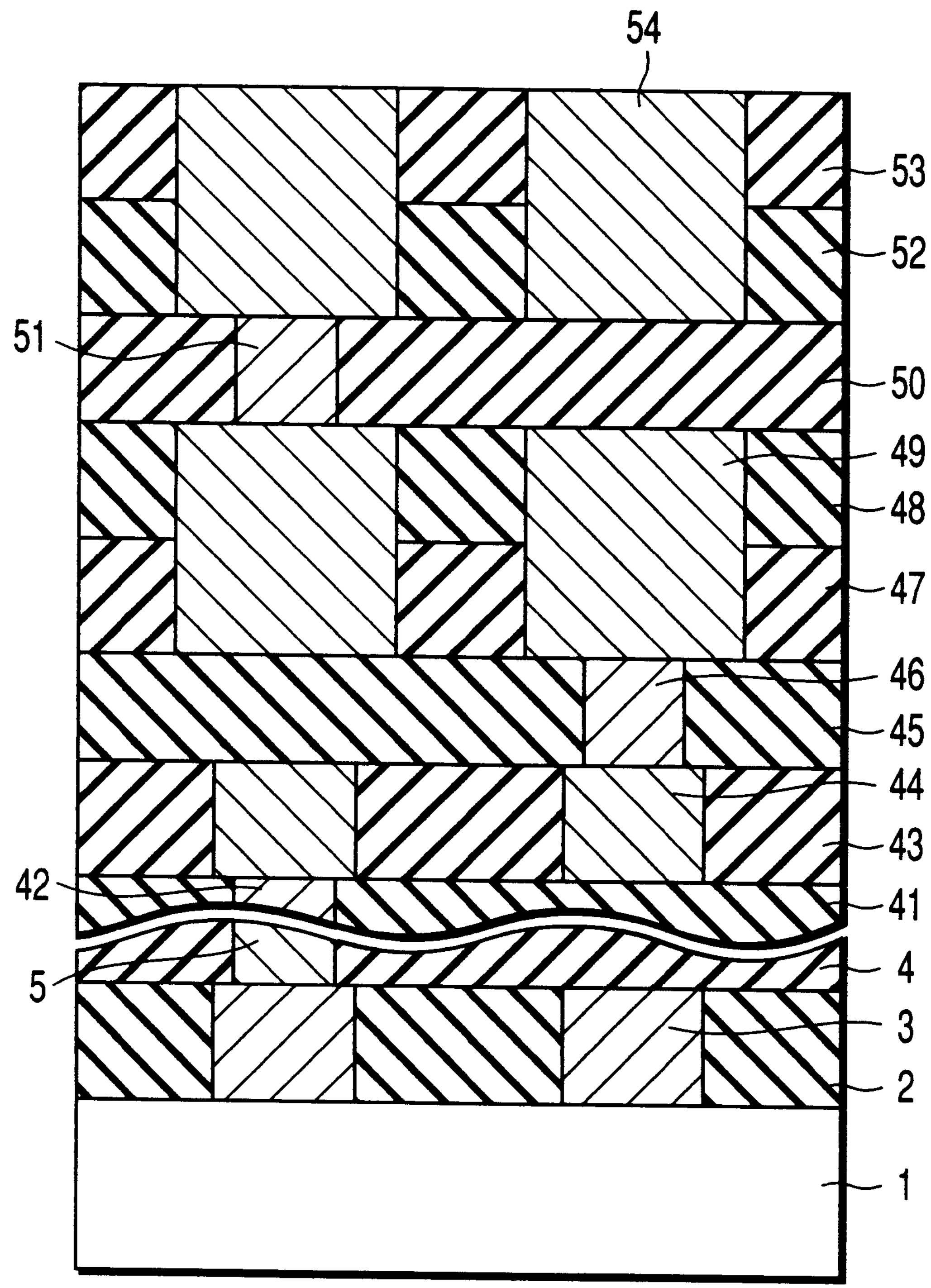

Next, as shown in FIG. 12H, grooves for Damascene wirings are formed in the third and fourth inter-wiring insulating films 52 and 53 such that the via plugs 50 is exposed. Further, as shown in FIG. 12I, a conductive film is formed on the fourth inter-wiring insulating film 53, including the grooves, and the other portions of the conductive film than the grooves are polished and removed by CMP or the like, thereby to form n-th layer wirings 54.

Thus, according to the present embodiment, not only the inter-wiring insulating film in the uppermost layer, which has the largest wiring width and wiring film thickness, but also the inter-wiring insulating film in the second uppermost layer are constructed in a layer structure comprised of insulating films between which the film stress and the film hardness differ. Materials of the inter-wiring insulating films are selected such that stresses caused at the insulating films thus layered are respectively effected in directions opposite to each other. In this manner, it is possible to manufacture a semiconductor device having a layer structure in which cracking or peeling is not caused at inter-wiring insulating films not only at wiring portions in the uppermost layer but also at wiring portions in the second uppermost layer.

In the fifth and sixth embodiments described above, Damascene process is used to form wirings with respect to all layers. However, it is possible to adopt a combination of a RIE wiring structure and a Damascene wiring structure.

Seventh Embodiment

FIGS. 13A to 13D are cross-sectional views showing steps of a method for manufacturing a semiconductor device, according to the seventh embodiment of the present invention. The semiconductor device manufactured in the present embodiment has the same structure as that manufactured in the fifth embodiment. However, the manufacturing method is different from that of the fifth embodiment, i.e., so-called dual Damascene process is used.

Figure 13A:
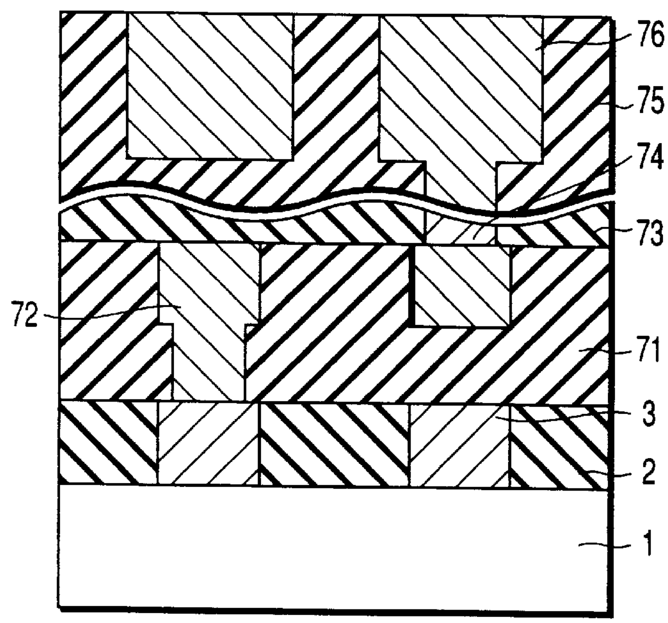
FIGS. 13A to 13D are cross-sectional views of steps, showing a method for manufacturing a semiconductor device according to the seventh embodiment of the present invention.

As shown in FIG. 13A, Damascene process is used to form first layer wirings 3 in the inter-wiring insulating film 2 on a semiconductor substrate 1, like the fifth embodiment. Next, an inter-layer insulating film 71 is formed, and via holes and grooves are formed in the inter-layer insulating film 71. In the present embodiment and the eighth embodiment described below, the inter-layer insulating film includes inter-wiring insulating films. The via holes are formed so as to penetrate through the film 71 to first layer wirings 3. Further, a conductive film is formed, including the via holes and the grooves. The other portions of the conductive film other than the grooves are polished and removed by CMP or the like, thereby to form second layer wirings 72.

Further, an inter-layer insulating film 73 and via plugs 74 to be connected to the second layer wirings 72 are formed on the second layer wirings 72 and the inter-layer insulating film 71. Wiring manufacturing steps of this kind using the dual Damascene process are repeated until (n−1)-th wirings 76 are formed in the inter-layer insulating film 75.

Figure 13B:
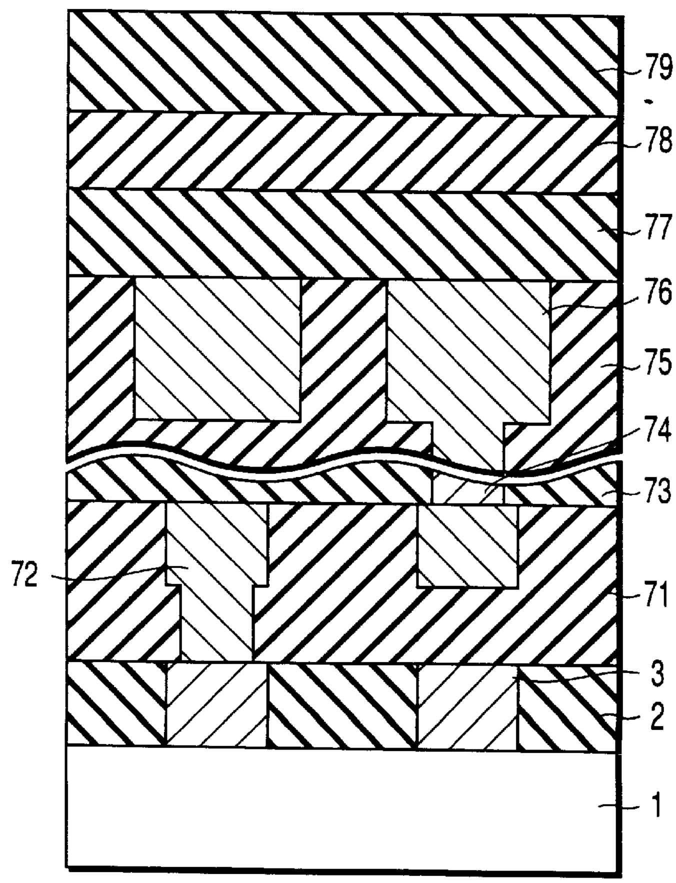

Next, as shown in FIG. 13B, an inter-layer insulating film 77, a first inter-wiring insulating film 78, and a second inter-wiring insulating film 79 are sequentially layered and formed on the inter-layer insulating film 75 and the (n−1)-th layer wirings 76. The same materials as those of the first and second inter-wiring insulating films 16 and 17 are respectively used for the first and second inter-wiring insulating films 16 and 17 shown in the fifth embodiment.

Figure 13C:
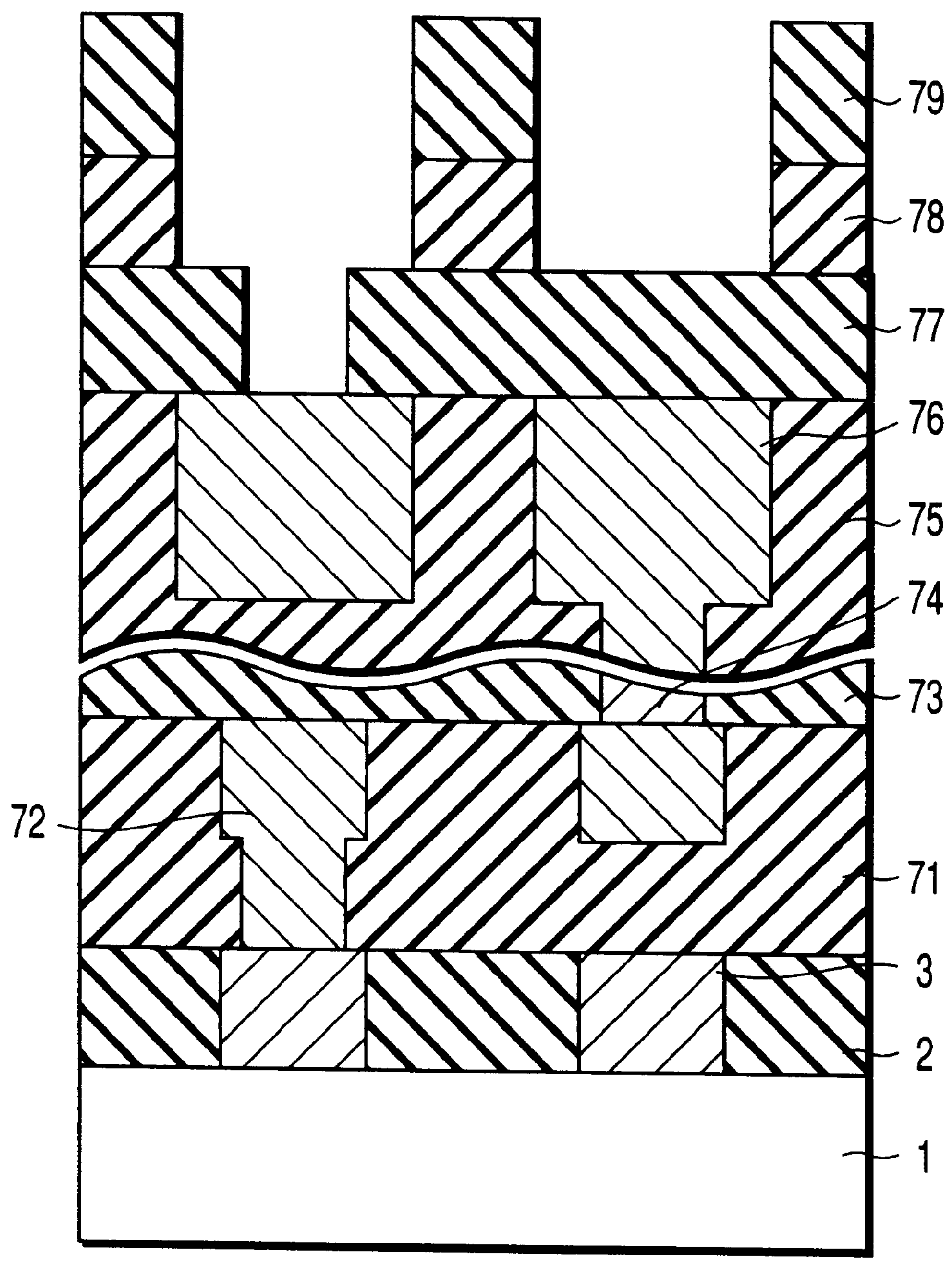
Figure 13D:
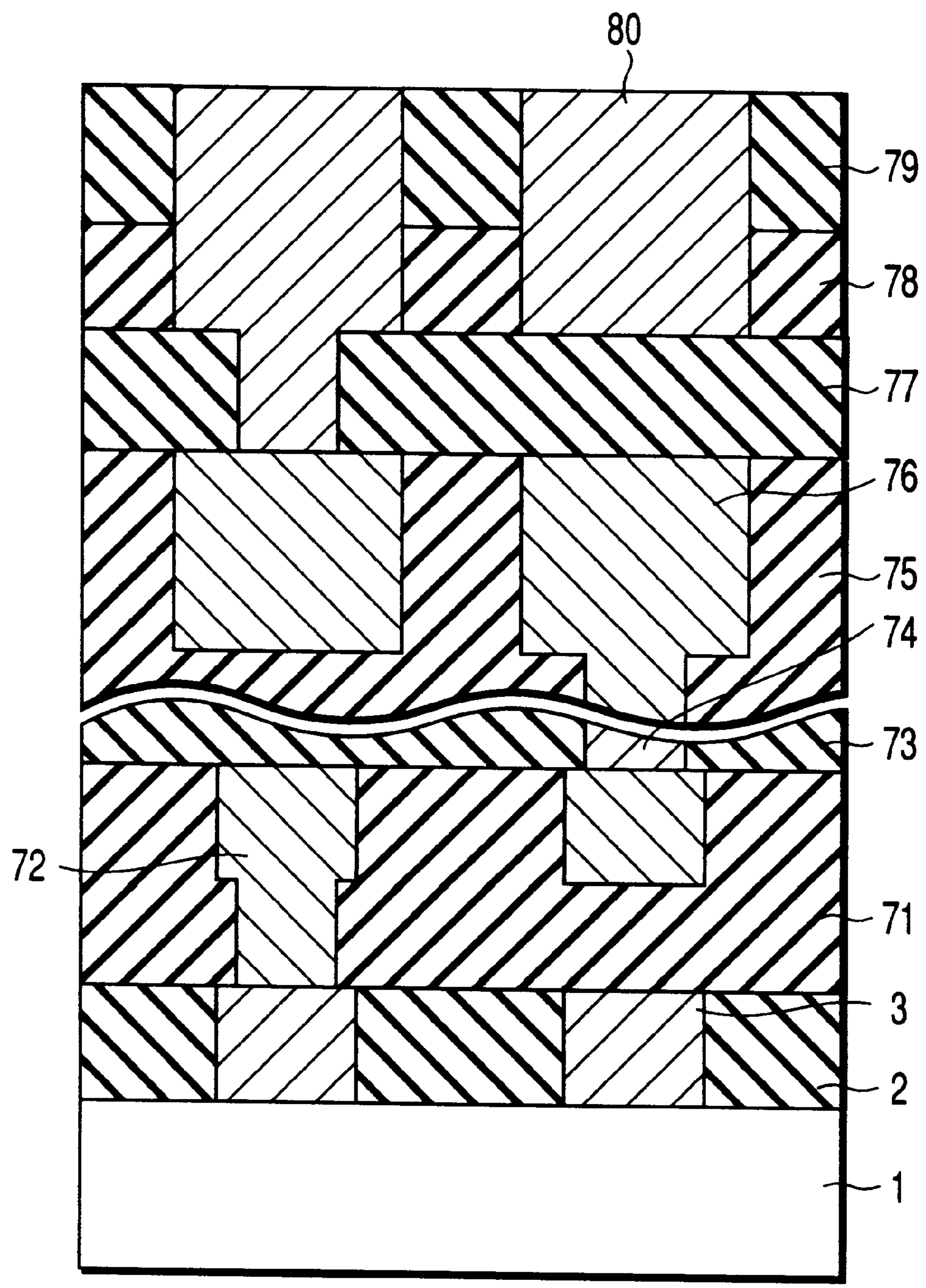

Next, as shown in FIG. 13C, via holes are formed in the inter-layer insulating film 77 and the first and second inter-wiring insulating films 78 and 79, such that a (n−1)-th layer wirings 76 are exposed, and a wiring grooves are formed so as to expose the inter-layer insulating film 77. Further, as shown in FIG. 13D, a conductive film is formed on the second inter-wiring insulating film 79, including the via holes and the wiring grooves. The other portions of the conductive film than the portions of the via holes and the wiring grooves are polished and removed, thereby to form n-th layer wirings 80.

Thus, it can be found that a semiconductor device having the same structure as that of the fifth embodiment can be manufactured in a method using the dual Damascene process, according to the present embodiment. Accordingly, even in a semiconductor device manufactured by the present embodiment, it is possible to obtain a multilayer wiring structure which does not cause cracking or peeling in the inter-wiring insulating films at the wiring portions in the uppermost layer.

Eighth Embodiment

FIGS. 14A to 14E are cross-sectional views showing steps of a method for manufacturing a semiconductor device, according to the eighth embodiment of the present invention. The semiconductor device manufactured in the present embodiment has the same structure as that of the sixth embodiment. However, the manufacturing method is different from that of the fifth embodiment, i.e., so-called dual Damascene process is used.

Figure 14A:
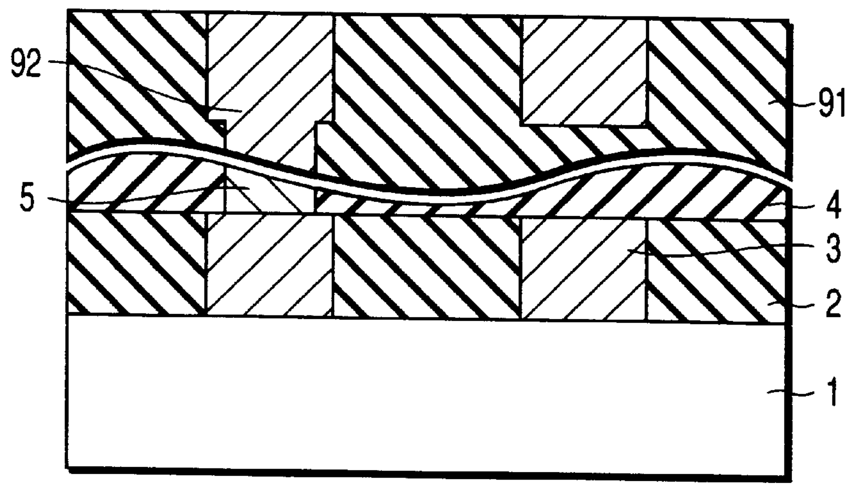
FIGS. 14A to 14E are cross-sectional views of steps, showing a method for manufacturing a semiconductor device according to the eighth embodiment of the present invention.

As shown in FIG. 14A, Damascene process is used to form first layer wirings 3 between inter-wiring insulating films 2 on a semiconductor substrate 1, like the fifth embodiment. Further, an inter-layer insulating film 4 is formed on the first layer wirings 3 and the inter-wiring insulating films 2, and via plugs 5 are formed of a conductive material in the inter-layer insulating film 4. These steps are repeated until (n−2)-th layer wirings 92 are formed in the inter-layer insulating film 91.

Figure 14B:
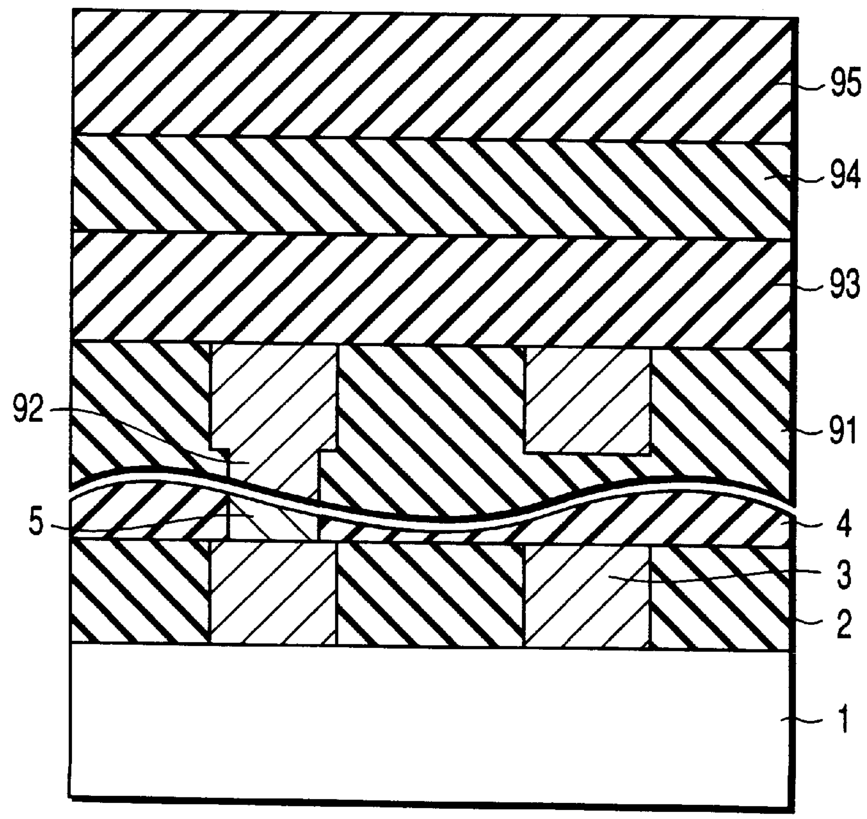

Next, as shown in FIG. 14B, an inter-layer insulating film 93, a first inter-wiring insulating film 94, and a second inter-wiring insulating film 95 are sequentially layered and formed on the (n−2)-th layer wirings 92 and the inter-layer insulating film 91. The same materials as those of the first and second inter-wiring insulating films 16 and 17 are respectively used for the first inter-wiring insulating film 94 and the second inter-wiring insulating film 95.

Figure 14C:
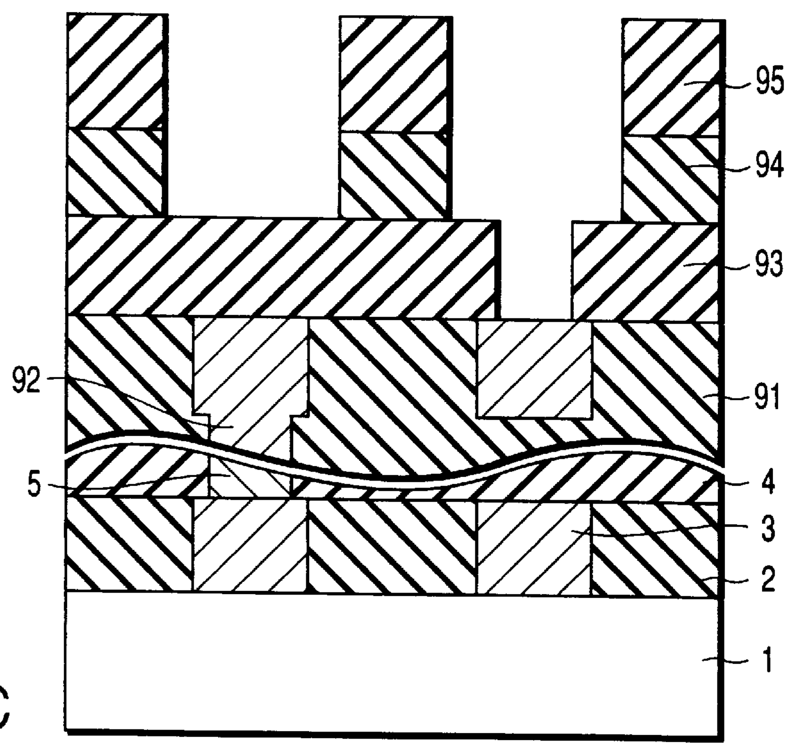
Figure 14D:
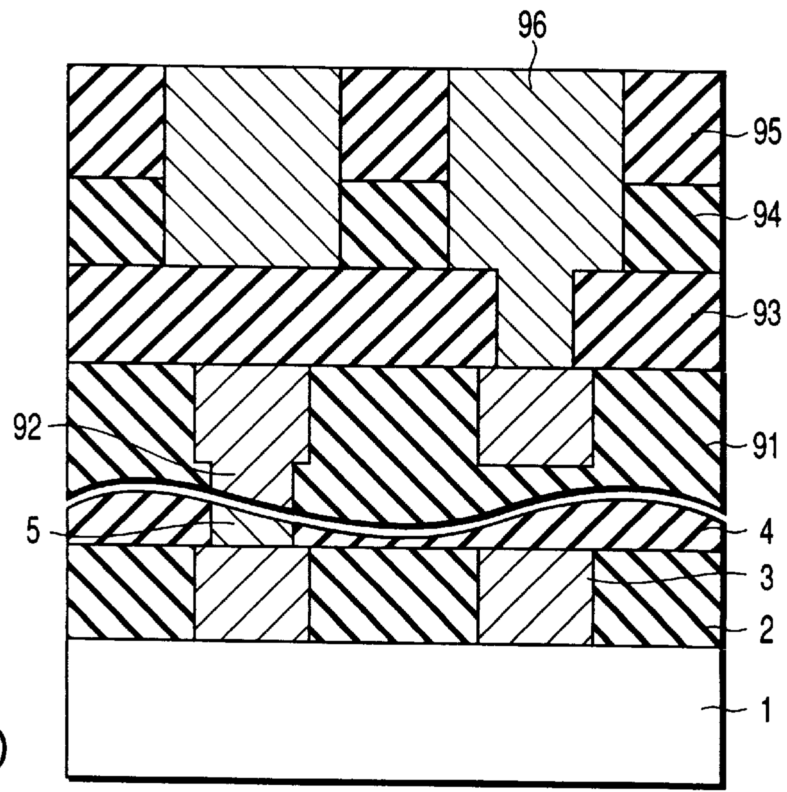

Next, as shown in FIG. 14C, via holes are formed in the inter-layer insulating film 93 and the first and second inter-wiring insulating films 94 and 95, such that a (n−1)-th layer wirings 92 are exposed, and wiring grooves are formed so as to expose the inter-layer insulating film 93. Further, as shown in FIG. 14D, a conductive film is formed on the second inter-wiring insulating film 95, including the via holes and the wiring grooves. The other portions of the conductive film than the portions of the via holes and the wiring grooves are polished and removed, thereby to form (n−1)-th layer wirings 96.

Figure 14E:
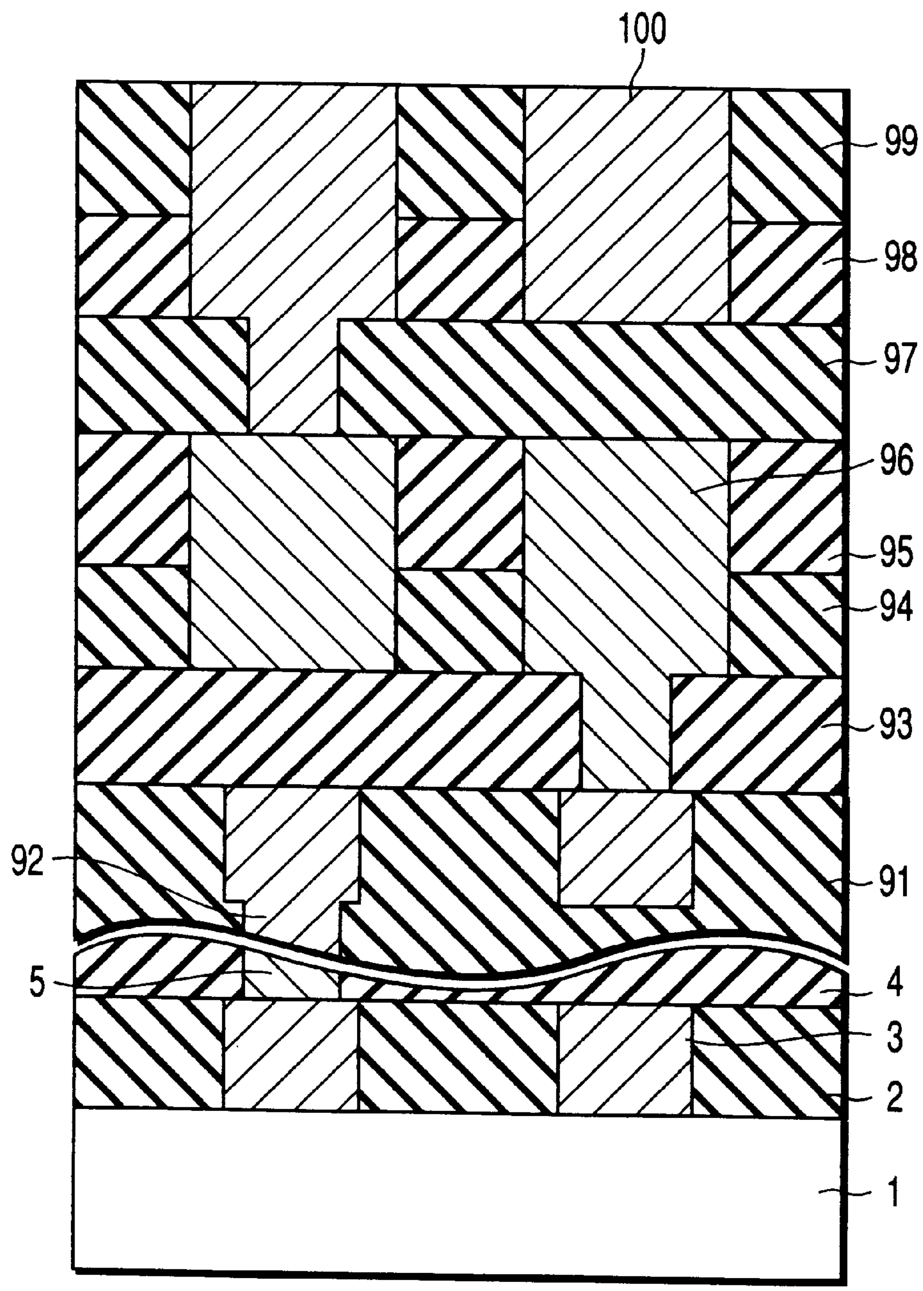

Further, as shown in FIG. 14E, with use of the same step as that used for forming the (n−1)-th layer wirings 96, n-th wirings 100 are formed in third and fourth inter-wiring insulating films 98 and 99 formed and layered. The same materials as those of the first and second inter-wiring insulating films 16 and 17 are respectively used for the third inter-wiring insulating film 98 and the fourth inter-wiring insulating film 99.

Thus, it can be found that a semiconductor device having the same structure as that of the sixth embodiment can be manufactured in a method using the dual Damascene process, according to the present embodiment. Accordingly, even in a semiconductor device manufactured by the present embodiment, it is possible to obtain a multilayer wiring structure which does not cause cracking or peeling in the inter-wiring insulating films at the wiring portions in the uppermost layer and the second uppermost layer.

Ninth Embodiment

Figure 15:
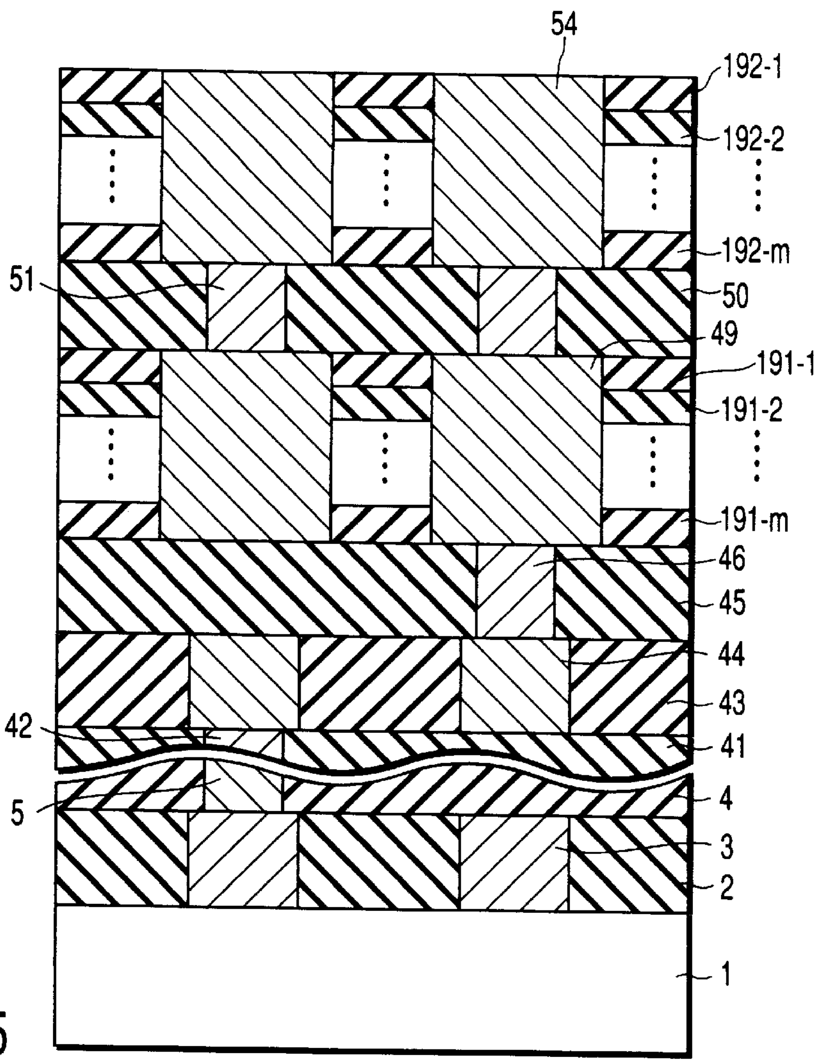
FIG. 15 is a cross-sectional view of a semiconductor device according to the ninth embodiment of the present invention.
Figure 16:
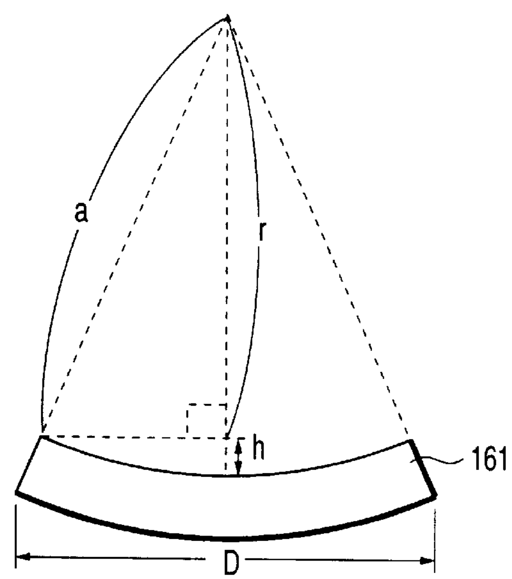
FIG. 16 is a view for explaining the definition of the film stress.

FIG. 15 is a cross-sectional view of a semiconductor device according to the ninth embodiment of the present invention. The semiconductor device is similar to those in the fifth to eighth embodiments in the point that the semiconductor device has a multilayer wiring structure comprised of n layers. Also, in the present embodiment, the inter-wiring insulating film for the n-th layer wirings 54 and the (n−1)-th layer wirings 49 are constructed in a layer structure comprised of insulating films between which the film stress and the film hardness differ. At this point, the present embodiment is similar to sixth embodiment. However, in the present embodiment, the layer structure does not comprise two layers but m layers (m≧2). These layer structures are supposed to include first to m-th inter-wiring insulating films 191-l to 191-m with respect to (n−1)th layer wirings 49, and first to m-th inter-wiring insulating films 192-l to 192-m with respect to n-th layer wirings 54, in order. In addition, the wiring thickness of the (n−1)-th layer wiring 49 and the n-th layer wiring 54 is 1 μm or more.

A structural example of the inter-wiring insulating films 191-l to 191-m and 192-l to 192-m constructed as described above will be shown in the Table 1.

TABLE 1

| the first inter-wiring insulating films 191-1, 192-1 | the second inter-wiring insulating films 191-2, 192-2 | the third inter-wiring insulating films 191-3, 192-3 |
|---|---|---|
| TEOS | organic insulating film | FSG |
| TEOS | silica-based porous film | FSG |
| TEOS | organic insulating film | TEOS |
| TEOS | silica-based porous film | TEOS |
| TEOS | organic insulating film | |
| TEOS | silica-based porous film | |
| USG | organic insulating film | FSG |
| USG | silica-based porous film | FSG |
| USG | organic insulating film | USG |
| USG | silica-based porous film | USG |
| USG | organic insulating film | |
| USG | silica-based porous film | |

In the Table 1, the TEOS film and USG film (Un-doped Silicate Glass) indicated by the first inter-wiring insulating films 191-1 or 192-1 are insulting films having high hardness and formed by CVD. The organic insulating film and the silica-based porous film indicated by the second inter-wiring insulating film 191-2 or 192-2 are low-dielectric-constant films and are also insulating films having low film hardness. The FSG (Fluorine Silicate Glass) film, the TEOS film, and the USG film indicated by the third inter-wiring insulating film 191-3 or 192-3 are insulating films having high hardness and formed by CVD.

By thus adopting a structure in which insulating films having high hardness and low hardness contact each other or a structure sandwiching these films, it is possible to reduce occurrence of cracking and peeling in inter-wiring insulating films. Needless to say, the combination of inter-wiring insulating films can be exchanged between the (n−1)-th layer and the n-th layer, and the present invention is not limited to the combination of inter-wiring insulating films shown in the Table 1.

Also, the present invention is not limited to the above embodiment. Although the above embodiment adopts a structure in which both of the film stress and the film hardness differ, the advantages of the present invention are achieved as long as the layers of films correct the stresses in directions in which the stresses are relaxed, if only the film stress or the film hardness differs. In addition, although inter-wiring insulating films layered in two layers are used, the number of layers is not limited hitherto. Also, inter-wiring insulating films used herein are obtained by layering insulating films between which the film stress or the film hardness differs. However, even if the inter-wiring insulating films have a structure in which the film stress or film hardness changes continuously in the film thickness direction, the advantages of the present invention can naturally be obtained as long as the inter-wiring insulating film as a whole function to relax the stress. In addition, even insulating films made of same elements may be layered if the basic characteristics of the films are different from each other.

Not only in the case where the film stress or the film hardness acts in different directions with respect to the stress which acts on the film but also in the case where the film as a reference is a material which makes the film stress act in a predetermined direction, the material will be acceptable as long as the material relaxes the film stress even if a material which makes the stress act in the same direction as the film stress is layered.

Although not particularly limited in the present embodiment, the present invention is applicable to general semiconductor devices such as a logic LSI, a DRAM, a SRAM, a CMOS, a bipolar transistor, and the like.

As has been specifically described above, according to the present invention, an insulating film having a structure in which at least one of the film stress and the film hardness differs in the film thickness direction is used as an inter-wiring insulating film formed between wirings, in a semiconductor device having a multilayer structure. Correction is made in directions in which stress caused in the film width direction is relaxed, or the insulating film has high hardness. Therefore, even if the dimensions of the wirings are large, it is possible to prepare a multilayer structure which does not cause cracking or peeling.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device having a wiring structure in which at least one wiring layer including a wiring and an insulating film surrounding the wiring and having a substantially flat upper surface is formed above a substrate, wherein the insulating film of the at least one wiring layer has one of a carbon concentration and a metal oxide concentration, one of which differs in a film thickness direction.

2. A semiconductor device having a multilayer wiring structure in which a plurality of wiring layers each including a wiring and an insulating film surrounding the wiring and having a substantially flat upper surface are formed and layered above a substrate, wherein the insulating film of at least one of the plurality of wiring layers has one of a carbon concentration and a metal oxide concentration, one of which is different from one of a carbon concentration and a metal oxide concentration of the insulating film of another one of the plurality of wiring layers.

3. A semiconductor device according to claim 2, wherein the insulating film of the at least one of the plurality of wiring layers has one of a carbon concentration and a metal oxide concentration, one of which differs in a film thickness direction.

4. A semiconductor device comprising:

a first wiring layer including a first insulating film and a plurality of wirings formed with the first insulating film interposed therebetween;

a plug formed to make contact with the wiring;

a second insulating film formed on the first wiring layer so as to cover a side portion of the plug;

a third insulating film formed on the second insulating film, having a carbon concentration lower than that of the second insulating film, and having a groove portion which is formed so as to expose the plug; and a second wiring layer which is formed in the groove portion.

5. A semiconductor device comprising:

a multilayer wiring structure comprising at least two wiring layers which are formed above a substrate and each of which has a plurality of wirings and an inter-wiring insulating film interposed therebetween, wherein the inter-wiring insulating film of at least one of the at least two wiring layers includes a first inter-wiring insulating film which comprises at least one of an FSG film, a TEOS film, and a USG film, a second inter-wiring insulating film which is formed on the first inter-wiring insulating film and which comprises at least one of an organic insulating film and a silica-based porous film, and a third inter-wiring insulating film which is formed on the second inter-wiring insulating film and which comprises at least one of a TEOS film and a USG film, upper surfaces of the first, second, and third inter-wiring insulating films are substantially flat, the first and second inter-wiring insulating films differ from each other in at least one of the film stress acting in a direction substantially parallel to the upper surfaces of the first and second inter-wiring insulating films and film hardness, and the second and third inter-wiring insulating films differ from each other in at least one of film stress acting in a direction substantially parallel to the upper surfaces of the second and third inter-wiring insulating films and film hardness; and an inter-layer insulating film which is interposed between the at least two wiring layers and which is formed above the substrate.

6. A semiconductor device according to claim 5, wherein the at least one of the at least two wiring layers including the first, second, and third inter-wiring insulating films is formed in an uppermost layer among the at least two wiring layers.

7. A semiconductor device according to claim 5, wherein the at least one of the at least two wiring layers including the first, second, and third inter-wiring insulating films is formed in two uppermost layers among the at least two wiring layers.

8. A semiconductor device comprising:

a multi-layer wiring structure comprising at least two wiring layer which are formed above a substrate and each of which has a plurality of wirings and an inter-wiring insulating film interposed therebetween, wherein the inter-wiring insulating film of at least one of the at least two wiring layers includes a first inter-wiring insulating film which comprises at least one of an FSG film, a TEOS film, and a USG film, a second inter-wiring insulating film which is formed on the first inter-wiring insulating film and which comprises at least one of an organic insulating film and a silica-based porous film, and a third inter-wiring insulating film which is formed on the second inter-wiring insulating film and which comprises at least one of a TEOS film and a USG film, upper surfaces of the first, second, and third inter-wiring insulating films are substantially flat, the first and second inter-wiring insulating films differ from each other in film stress acting in a direction substantially parallel to the upper surfaces of the first and second inter-wiring insulating films, and the second and third inter-wiring insulating films differ from each other in film stress acting in a direction substantially parallel to the upper surfaces of the second and third inter-wiring insulating films; and an inter-layer insulating film which is interposed between the at least two wiring layers and which is formed above the substrate.

9. A semiconductor device according to claim 5, wherein a direction in which a film stress of the first inter-wiring insulating film acts differs from a direction in which a film stress of the second inter-wiring insulating film acts, and the direction in which the film stress of the second inter-wiring insulating film acts differs from a direction in which a film stress of the third inter-wiring insulating film acts.

10. A semiconductor device according to claim 5, wherein film stresses of the first, second, and third inter-wiring insulating films act in a same direction.

11. A semiconductor device according to claim 5, wherein film hardness of the first and third inter-wiring insulating films are higher than film hardness of the second inter-wiring insulating film.

12. A semiconductor device according to claim 5, wherein the second inter-wiring insulating film has a relative dielectric constant of 3 or less.

13. A semiconductor device according to claim 8, wherein a direction in which a film stress of the first inter-wiring insulating film acts differs from a direction in which a film stress of the second inter-wiring insulating film acts, and the direction in which the film stress of the second inter-wiring insulating film acts differs from a direction in which a film stress of the third inter-wiring insulating film acts.

14. A semiconductor device according to claim 8, wherein film stresses of the first, second, and third inter-wiring insulating films act in a same direction.

15. A semiconductor device according to claim 8, wherein film hardnesses of the first and third inter-wiring insulating films are higher than a hardness of the second inter-wiring insulating film.

16. A semiconductor device according to claim 8, wherein the second inter-wiring insulating film has a relative dielectric constant of 3 or less.

17. A semiconductor device according to claim 5, wherein the first inter-wiring insulating film is an FSG film, and the third inter-wiring insulating film comprises at least one of a TEOS film and a USG film.

18. A semiconductor device according to claim 8, wherein the first inter-wiring insulating film is an FSG film, and the third inter-wiring insulating film comprises at least one of a TEOS film and a USG film.

* * * * *

UNITED STATES PATENT AND TRADEMARK OFFICE

CERTIFICATE OF CORRECTION

PATENT NO. : 6,534,870 B1
DATED : March 18, 2003
INVENTOR(S) : Shimooka et al.

It is certified that error appears in the above-identified patent and that said Letters Patent is hereby corrected as shown below:

Column 21,
Line 8, change "layer" to -- layers --.

Signed and Sealed this

Tenth Day of June, 2003

JAMES E. ROGAN
*Director of the United States Patent and Trademark Office*